(12) United States Patent
Scheiper et al.

(10) Patent No.: US 8,507,348 B2
(45) Date of Patent: Aug. 13, 2013

(54) FIELD EFFECT TRANSISTORS FOR A FLASH MEMORY COMPRISING A SELF-ALIGNED CHARGE STORAGE REGION

(75) Inventors: Thilo Scheiper, Dresden (DE); Sven Beyer, Dresden (DE); Uwe Griebenow, Markkleeberg (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 205 days.

(21) Appl. No.: 12/939,282

(22) Filed: Nov. 4, 2010

(65) Prior Publication Data
US 2011/0211394 A1 Sep. 1, 2011

(30) Foreign Application Priority Data
Feb. 26, 2010 (DE) .................. 10 2010 002 455

(51) Int. Cl.
*H01L 21/336* (2006.01)
(52) U.S. Cl.
USPC .................. 438/287; 438/257; 438/591
(58) Field of Classification Search
USPC .......................... 438/287, 257, 59
See application file for complete search history.

(56) References Cited

U.S. PATENT DOCUMENTS

| 6,831,325 | B2 | 12/2004 | Lojek ............................ 257/315 |
| 6,844,587 | B2 | 1/2005 | Kang ............................ 257/316 |
| 7,217,624 | B2 | 5/2007 | Lim et al. ...................... 438/302 |
| 7,262,458 | B2 | 8/2007 | Yoshioka et al. ............. 257/324 |
| 2002/0142543 | A1 | 10/2002 | Lin et al. ....................... 438/257 |
| 2004/0232475 | A1 | 11/2004 | Kattaoka et al. .............. 257/315 |
| 2006/0125122 | A1 | 6/2006 | Roizin et al. .................. 257/900 |

FOREIGN PATENT DOCUMENTS
DE 102004063690 A1 4/2006

OTHER PUBLICATIONS

Translation of Official Communication from German Patent Office for German Patent Application No. 10 2010 002 455.4 dated Feb. 6, 2012.

*Primary Examiner* — Long Pham
(74) *Attorney, Agent, or Firm* — Williams, Morgan & Amerson, P.C.

(57) ABSTRACT

Storage transistors for flash memory areas in semiconductor devices may be provided on the basis of a self-aligned charge storage region. To this end, a floating spacer element may be provided in some illustrative embodiments, while, in other cases, the charge storage region may be efficiently embedded in the electrode material in a self-aligned manner during a replacement gate approach. Consequently, enhanced bit density may be achieved, since additional sophisticated lithography processes for patterning the charge storage region may no longer be required.

6 Claims, 21 Drawing Sheets

FIELD EFFECT TRANSISTORS FOR A FLASH MEMORY COMPRISING A SELF-ALIGNED CHARGE STORAGE REGION

BACKGROUND OF THE INVENTION

1. Field of the Invention

Generally, the present disclosure relates to the field of integrated circuits, and, more particularly, to field effect transistors used for non-volatile information storage.

2. Description of the Related Art

Integrated circuits typically comprise a great number of circuit elements on a given chip area according to a specified circuit layout, wherein advanced devices may comprise millions of signal nodes that may be formed by using field effect transistors, which may also be referred to herein as MOS transistors. Thus, field effect transistors may represent a dominant component of modern semiconductor products, wherein advances towards increased performance and low integration volume are mainly associated with a reduction of size of the basic transistor structures. Generally, a plurality of process technologies are currently practiced, wherein, for complex circuitry, such as microprocessors, storage chips, ASICs (application specific ICs) and the like, MOS technology is currently one of the most promising approaches due to the superior characteristics in view of operating speed and/or power consumption and/or cost efficiency. During the fabrication of complex integrated circuits using MOS technology, millions of field effect transistors, i.e., N-channel transistors and/or P-channel transistors, are formed on a substrate including a crystalline semiconductor layer. A MOS transistor, irrespective of whether an N-channel transistor or a P-channel transistor is considered, comprises so-called PN junctions represented by an interface formed of highly doped drain and source regions and an inversely or weakly doped channel region disposed between the drain region and the source region. The conductivity of the channel region, i.e., the drive current capability of the conductive channel, is controlled by a gate electrode formed above the channel region and separated therefrom by a thin insulating layer.

Due to the decreased dimensions of circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC). Furthermore, in sophisticated microcontroller devices, an increasing amount of storage capacity may be provided on chip within the CPU core, thereby also significantly enhancing the overall performance of modern computer devices. Similarly, in many types of control circuits, different types of storage devices may be incorporated so as to provide an acceptable compromise between die area consumption and information storage density on the one side versus operating speed on the other side. For instance, fast or temporary buffer memories, so-called cache memories, may be provided in the vicinity of the CPU core, wherein respective cache memories may be designed so as to allow reduced access times compared to external storage devices.

On the other hand, increasingly, non-volatile memories may have to be incorporated in sophisticated semiconductor devices, wherein the flash memory technique represents one promising technology, in which MOS technology may be efficiently applied to forming storage cells. To this end, basically, a field effect transistor is provided, in which transistor operation is controlled, on the other hand, by a gate electrode, as discussed above, which additionally includes a floating gate that is electrically insulated from the control gate electrode and from the channel region and drain region of the field effect transistor. The floating gate represents a dielectric charge storage region within the control gate electrode of the field effect transistor and may hold stationary charge carriers, which in turn influence the current flow behavior of the field effect transistor. The stationary charge carriers in the floating gate may be injected upon establishing a specific operation mode, which is also referred to as programming of the memory cell, in which per se negative effects, such as hot carrier injection and the like, that is, any type of leakage current generating mechanism, may result in the incorporation of charge carriers in the charge storage region. Consequently, in the normal operation mode, the injected charge carriers in the charge storage region may thus significantly affect the current flow through the channel region of the transistor, which may be detected by appropriate control circuitry. On the other hand, upon erasing the memory cell, the charge carriers in the charge storage region may be removed, for instance by establishing appropriate voltage conditions, thereby establishing a detectable different operational behavior of the field effect transistor during the normal operation mode, i.e., during the operation with the standard supply voltages. Although the concept of flash memory cells, i.e., of field effect transistors comprising a floating gate, provides a non-volatile storage mechanism with moderately high information density and low access times, in turns out that further device scaling and compatibility to other sophisticated mask technologies may be difficult to be achieved on the basis of conventional concepts for forming non-volatile storage transistors, as will be described in more detail with reference to FIGS. 1a-1e.

FIG. 1a schematically illustrates a cross-sectional view of a semiconductor device 100, which may represent any semiconductor device including a flash memory area. For example, the semiconductor device 100 represents a memory chip, a control circuit including a non-volatile memory and the like. For convenience, a single memory cell 150 is illustrated in FIG. 1a, which is provided in the form of a field effect transistor, which may also be referred to herein as a non-volatile storage transistor. The device 100 comprises a substrate 101 and a semiconductor layer 102 formed thereabove, such as a silicon layer and the like. It should be appreciated that the substrate 101 and the semiconductor layer 102 may represent a silicon-on-insulator (SOI) configuration, if a buried insulating layer (not shown) is provided between the substrate 101 and the semiconductor layer 102. In other cases, the semiconductor layer 102 represents a portion of a crystalline material of the substrate 101, thereby providing a bulk configuration. The semiconductor layer 102 comprises a semiconductor region or active region 102A, in and above which the transistor 150 is formed. The active region 102A may be laterally delineated by any appropriate isolation structure (not shown), such as a shallow trench isolation and the like.

The transistor 150 comprises a gate electrode structure 160 formed on the semiconductor region 102A so as to control the current flow between a source region 151 and a drain region 152, by controlling the conductivity state of a channel region 153, which is laterally positioned between the source region 151 and the drain region 152. The gate electrode structure 160 comprises a gate dielectric material 161, which is typically comprised of silicon dioxide or silicon oxynitride, with an appropriate thickness of, for instance, several nanometers in sophisticated applications. Furthermore, a gate electrode 163 is formed on the gate dielectric material 161 and is typically comprised of polysilicon material 163A, possibly in combination with a contact material 163B in the form of a metal silicide, such as nickel silicide. Furthermore, the gate electrode structure 160 comprises a charge storage region 162, typically comprised of silicon nitride, which may also be referred to as a floating gate, since the charge storage region 162 may be embedded in a dielectric material so as to be electrically insulated from the gate electrode 163 and from the channel region 153 and the drain region 152 and may influence the current flow in the channel region 153. For example, the gate dielectric material 161 in combination with an additional dielectric material 161A may provide dielectric encapsulation of the charge storage region 162. Moreover, as illustrated in FIG. 1*a*, the charge storage region 162 is positioned so as to overlap with a portion of the drain region 152 and a portion of the channel region 153. That is, the charge storage region 162 is positioned at an area in which high energetic charge carriers may be present upon applying appropriate voltages to the drain and source regions 152, 151 and the gate electrode structure 160, which may thus enable the injection or removal of charge carriers to and from the charge storage region 162, as will be described later on in more detail.

Furthermore, the transistor 150 may comprise a sidewall spacer structure 156 formed on sidewalls of the gate electrode 163, which may have any appropriate configuration so as to appropriately define the lateral and vertical profile of the drain and source regions 152, 151. Moreover, as illustrated, contact areas 154, such as metal silicide regions, are provided in the source and drain regions 151, 152.

In the manufacturing stage shown, the semiconductor device 100 further comprises a contact structure 120, which may comprise any appropriate dielectric material or materials, such as a layer 121, for instance in the form of a silicon nitride material, followed by a second dielectric material 122, such as a silicon dioxide material. Additionally, the contact structure 120 comprises contact elements 123 so as to connect to the source and drain regions 151, 152 and to the gate electrode structure 160. It should be appreciated that the contact elements 123 connecting to the source and drain regions 151, 152 and the contact element 123 connecting to the gate electrode structure 160 are typically formed at different levels in a direction perpendicular to the drawing plane of FIG. 1*a*, i.e., in the direction of the transistor width of the transistor 150.

The semiconductor device 100 is typically formed on the basis of any appropriate process strategy, during which other field effect transistors may also be provided in the device 100. For example, the active region 102A may be formed by providing corresponding isolation structures and establishing a desired basic dopant profile in the region 102A by applying well-established implantation processes and masking techniques. Next, the gate dielectric material 161 may be formed with an appropriate thickness on the transistor 150, while, in other device areas, a reduced thickness may be applied, depending on the overall device requirements. Next, a material for the charge storage region 162 may be provided and may be subsequently patterned on the basis of an appropriate lithography process. Next, dielectric material 161A is formed and may be patterned, depending on the overall process strategy. Thereafter, the electrode material 163A, possibly in combination with further materials, such as hard mask materials, dielectric cap materials and the like, are deposited and may be subsequently patterned on the basis of sophisticated lithography and anisotropic etch techniques. Next, the drain and source regions 151, 152 may be formed, for instance, by a first implantation sequence so as to provide the desired overlap of the regions 151, 152 with the gate electrode structure 160, followed by the deposition and patterning of any appropriate dielectric material for forming the sidewall spacer structure 156, which may then be used as an implantation mask for performing a subsequent implantation process for forming deeper areas of the drain and source regions 151, 152. Based on one or more anneal processes, the final dopant profile is then established and the metal silicide regions 154 and 163B are formed by well-established process techniques. Next, the contact structure 120 may be formed by depositing the materials 121 and 122 and patterning the same so as to form corresponding contact openings, which may be subsequently filled with any appropriate conductive material, such as tungsten and the like, thereby providing the contact elements 123.

FIG. 1*b* schematically illustrates the semiconductor device 100 in an operating mode, in which the transistor 150 may be programmed. It should be appreciated that the transistor 150 represents an N-channel transistor in the example illustrated, i.e., the source and drain regions 151, 152 are heavily N-doped, while the channel region 153 is P-doped. When programming the transistor 150, i.e., when transferring charge carriers 155A, that is, electrons, into the charge storage region 162, a relatively high programming voltage is applied to the gate electrode structure 160 and the drain 152. For example, 12 volts may be applied and may represent a typical programming voltage. On the other hand, the source region 151 is connected to the low supply voltage of the device 100, i.e., 0 volts. In this operational mode, a conductive channel 155 may build up from the source region 151 via the channel region 153 so as to connect to the drain region 152. That is, electrons start flowing from the source region 151 to the drain region 152 and may thus be subjected to hot carrier injection or any other leakage current mechanisms, in which electrons are gathering sufficient energy so as to move through the dielectric material 161 and to be trapped in the region 162.

FIG. 1*c* schematically illustrates the device 100 during the normal operating mode, i.e., in an operating mode in which the transistor 150 may be read out in order to determine the state of the transistor 150 and thus the information contained therein, which is associated with the state of the transistor 150. Thus, during this operating mode, the regular supply voltage may be applied, such as 1 volt at the gate electrode structure 160, while the source 151 is at the low supply voltage, i.e., 0 volts. In this case, the positive charges 165 may result in the establishment of a conductive channel 155, which, however, may be pinched off at the drain side 152 due to the presence of the stationary charges 155A, which have previously been programmed into the charge storage region 162. Consequently, a current flow is not established between the source and drain regions 151, 152, and this high impedance state of the transistor 150 may be detected by any appropriate control circuitry (not shown). Hence, since the charges 155A may subsequently not be affected by the typical operating voltages, except for extremely small leakage currents and the like, the charges 155A may be considered as stationary and may thus provide the non-volatile behavior of the transistor 150, that is, even after switching off the supply voltage, the charges 155A may remain trapped within the region 162.

FIG. 1*d* schematically illustrates the device 100 during an erase cycle, so as to re-write the transistor 150 with an inverse information bit. To this end, a moderately high voltage that is significantly above the typical supply voltage, such as 12 volts, is supplied to drain region 152, while the gate electrode structure 160 is connected to the low supply voltage, i.e., 0 volt. In this case, the charges 155A may be removed from the region 162, for instance by quantum mechanical effects, which are typically known as Fowler-Nordheim tunneling. Hence, the charges 155A may be removed via the channel region 153 and the drain region 152.

FIG. 1e schematically illustrates the device 100 after erasing the transistor 150 during the normal operating mode. Next, upon applying the normal operating voltage to the gate electrode structure 160, for instance 1 volt, the conductive channel 155 may build up and may now extend to the drain region 152, thereby providing a low impedance state for the transistor 150, which may thus be detected by the corresponding control circuitry.

The basic configuration of the transistor 150 may thus provide a non-volatile storage behavior, wherein a single field effect transistor may be sufficient to store at least 1 bit of information, thereby contributing to a high bit density. It turns out, however, that a further scaling of the overall device dimension may result in significant difficulties for the conventional concept, since, for instance, the charge storage region 162 is patterned on the basis of a lithography process, thereby requiring certain minimum dimensions that are within the capability of the sophisticated lithography techniques. Consequently, the length of the gate electrode structure 160 may not be reduced, as is desirable in view of enhancing the overall information density. Moreover, in sophisticated applications, increasingly, superior gate electrode structures are used for standard field effect transistors in order to reduce overall dimensions and increase performance. In these strategies, a high-k dielectric material, i.e., a material having a dielectric constant of 10.0 or higher, is provided in the gate insulation layer, in combination with a metal-containing electrode material, wherein various sophisticated process strategies have been developed, which may not be compatible with the conventional concept of providing a non-volatile storage transistor, such as the transistor 150. For example, so-called replacement gate approaches have been developed, in which the high-k dielectric material in combination with appropriate electrode metals are provided in a very late manufacturing stage, i.e., after completing the basic transistor configuration, which may not be compatible with a conventional storage transistor configuration. Consequently, the efficiency and information density provided by conventional non-volatile storage transistors may not be enhanced in a desired manner, even if highly sophisticated manufacturing strategies are applied for field effect transistors in other device areas.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices, manufacturing techniques and methods of programming non-volatile storage transistors, in which superior performance may be accomplished by applying a self-aligned charge storage region in the storage transistor. To this end, in some illustrative aspects disclosed herein, the charge storage region may be provided within a sidewall spacer structure that may per se be self-aligned during the fabrication process with respect to the gate electrode structure and at least the drain region. In other illustrative aspects disclosed herein, the charge storage region may be embedded in the electrode material, however, without requiring any additional lithography process, which may be accomplished by applying a replacement gate approach, in which a placeholder material of the gate electrode structure may be removed in a late manufacturing stage so as to provide a gate opening, which may be subsequently used for a process for modifying the etch resistivity of a dielectric material, based on which the charge storage region may be provided within the gate opening.

The self-aligned nature of the charge storage region may further provide superior compatibility to sophisticated manufacturing techniques and transistor structures, for instance in terms of sophisticated gate electrode structures, thereby enabling an efficient implementation of non-volatile storage transistors into complex semiconductor devices, wherein, additionally, the overall lateral dimensions of the storage transistors may be reduced due to the self-aligned nature of the fabrication process. Moreover, upon using sophisticated materials, such as high-k dielectric materials, in some illustrative aspects disclosed herein, superior conditions may be achieved during the programming and erasing of the non-volatile storage transistor, which may be accomplished by taking advantage of superior material characteristics of high-k dielectric materials, such as hafnium oxide and the like. To this end, in some illustrative embodiments disclosed herein, the programming and also the erasing of the storage transistor may be accomplished by charge carrier transfer from the gate electrode from and to the charge storage region, without requiring charge carrier transfer through a gate insulation layer from the channel region into the charge storage region, as is the case in conventional storage transistors. Consequently, reduced programming and erasing voltages may be applied, while also endurance of the storage transistor may be increased, since the sensitive gate dielectric material may no longer act as an interface for transferring charges on the basis of hot carrier injection.

One illustrative non-volatile storage transistor disclosed herein comprises a gate electrode formed above a semiconductor region and separated therefrom by a gate insulation layer. The non-volatile storage transistor further comprises a source region formed in the semiconductor region that connects to a channel region at a source site of the storage transistor. Moreover, the transistor comprises a drain region formed in the semiconductor region so as to connect to the channel region at a drain site of the storage transistor. Additionally, a floating sidewall spacer is formed at a sidewall of the gate electrode, at least at the drain site of the transistor, wherein the floating sidewall spacer is formed above a portion of the channel region and above a portion of the drain region. Furthermore, a first dielectric layer is formed so as to separate the floating sidewall spacer from the gate electrode and a second dielectric layer is formed so as to separate the floating sidewall spacer from the channel region and the drain region.

One illustrative method disclosed herein relates to storing information in a non-volatile storage transistor. The method comprises providing a charge storage region adjacent and electrically insulated from a drain region and a gate electrode of the storage transistor, wherein the charge storage region is positioned so as to influence charge carrier flow in a channel region of the storage transistor. The method additionally comprises applying a programming voltage between the gate electrode structure and the drain region of the storage transistor so as to initiate charge carrier transfer from the gate electrode to the charge storage region.

One illustrative method disclosed herein relates to forming a non-volatile storage transistor. The method comprises forming a gate electrode structure on a semiconductor region and forming a dielectric charge storage region in a self-aligned manner adjacent to and electrically insulated from a channel region and a drain region of the storage transistor.

BRIEF DESCRIPTION OF THE DRAWINGS

The disclosure may be understood by reference to the following description taken in conjunction with the accompanying drawings, in which like reference numerals identify like elements, and in which.

Figure 1A:
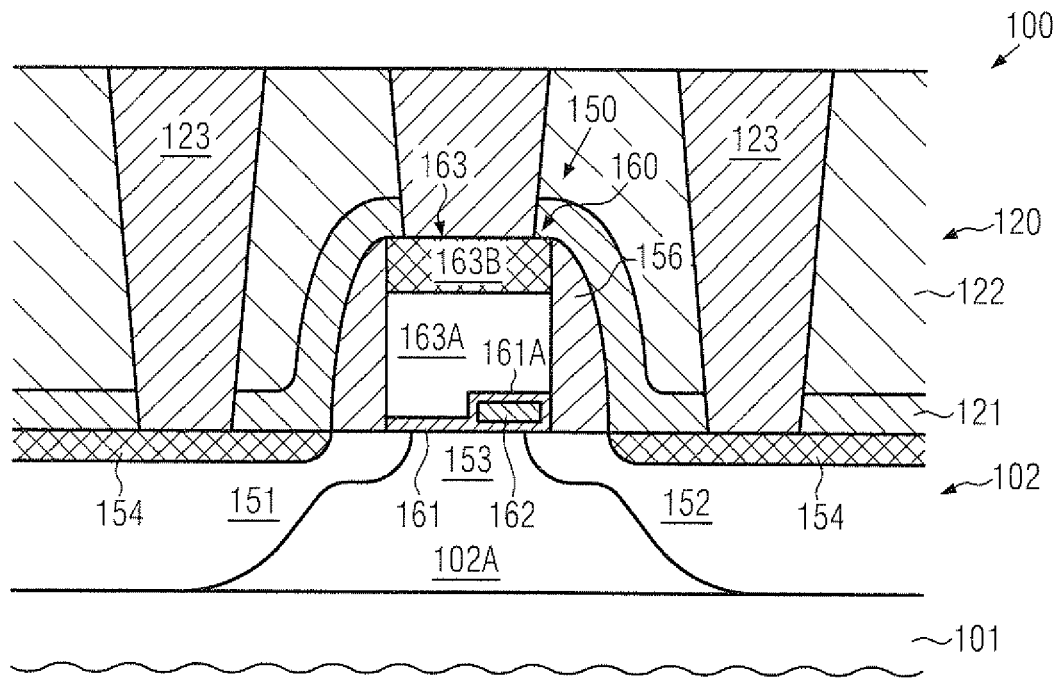
FIG. 1a schematically illustrates a cross-sectional view of a conventional non-volatile storage transistor for a flash memory cell including a floating gate or charge storage region.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides non-volatile storage transistors, which may be used in flash memory areas of any type of semiconductor device, wherein superior performance and/or scalability may be accomplished by generally providing the charge storage region of the storage transistor in a self-aligned manner, thereby eliminating the requirement for a sophisticated lithography process, or appropriately positioning the charge storage region adjacent to the channel region and the drain region of the transistor. To this end, in some illustrative embodiments, the sidewall spacer structure, or at least a portion thereof, may be advantageously used as the charge storage region, which may thus be self-aligned without requiring any specific lithography processes. The sidewall spacer, which may also be referred to herein as a floating spacer, may be appropriately positioned at the drain site of the transistor so as to be positioned above a portion of the channel region and above a portion of the drain region by providing an asymmetric drain source configuration, which may be accomplished by applying a drain source extension implantation using a tilt angle. Moreover, the concept of a floating spacer may be applied to sophisticated gate electrode structures, for instance comprising a high-k dielectric material in combination with a metal-containing electrode material, wherein, in some illustrative embodiments, the different leakage characteristics of conventional dielectrics and high-k dielectric materials may be taken advantage of in order to enable the programming and erasing of the storage transistor with significantly reduced voltages compared to conventional concepts. To this end, sophisticated replacement gate approaches may be applied, in which the high-k dielectric material may electrically insulate the floating spacer element from the electrode metal of the gate electrode structure, which may result in increased leakage currents above a certain gate voltage compared to conventional dielectrics, which may be formed below the floating spacer so as to isolate the spacer from the drain region and the channel region. In this case, upon applying an appropriate voltage, which may, however, be significantly less compared to conventional programming and erasing voltages, charge transfer may take place from the gate electrode to the floating spacer, thereby not requiring a charge carrier transfer through the gate dielectric layer.

In other illustrative embodiments, the concept of a floating spacer may be applied to any gate electrode structure, such as a high-k metal gate electrode structure or a conventional gate electrode structure, thereby providing a high degree of design flexibility.

In other illustrative embodiments disclosed herein, the charge storage region may be embedded in the electrode material of the gate electrode structure in a self-aligned manner, which may be accomplished by removing a placeholder material of the gate electrode structure in an advanced manufacturing stage and using the resulting gate opening as an efficient mask, for instance for a tilted implantation process, so as to provide a locally varying etch rate of a dielectric material within the gate opening. Thereafter, on the basis of dielectric material having the locally varying etch rate, the material of the charge storage region may be appropriately patterned and subsequently a dielectric material, such as high-k dielectric material, and an electrode metal may be filled into the gate opening. In some illustrative embodiments, also in this case, the advantageous behavior of the high-k dielectric material may be taken advantage of in order to induce charge carrier transition upon programming and erasing the storage transistor within the gate electrode structure rather than between the channel region and the embedded charge storage region.

As a consequence, non-volatile storage transistors of any conductivity type, such as N-channel transistors and P-channel transistors, may be provided with reduced overall dimensions without being restricted by lithography, wherein, if desired, compatibility with sophisticated gate electrode structures formed on the basis of a high-k dielectric material and a metal-containing electrode material may be achieved. Consequently, high density non-volatile memory areas may be provided or may be incorporated into any type of complex semiconductor device.

With reference to FIGS. 2a-2u and 3a-3h, further illustrative embodiments will now be described in more detail, wherein reference may also be made to FIGS. 1a-1e, if appropriate.

Figure 2A:
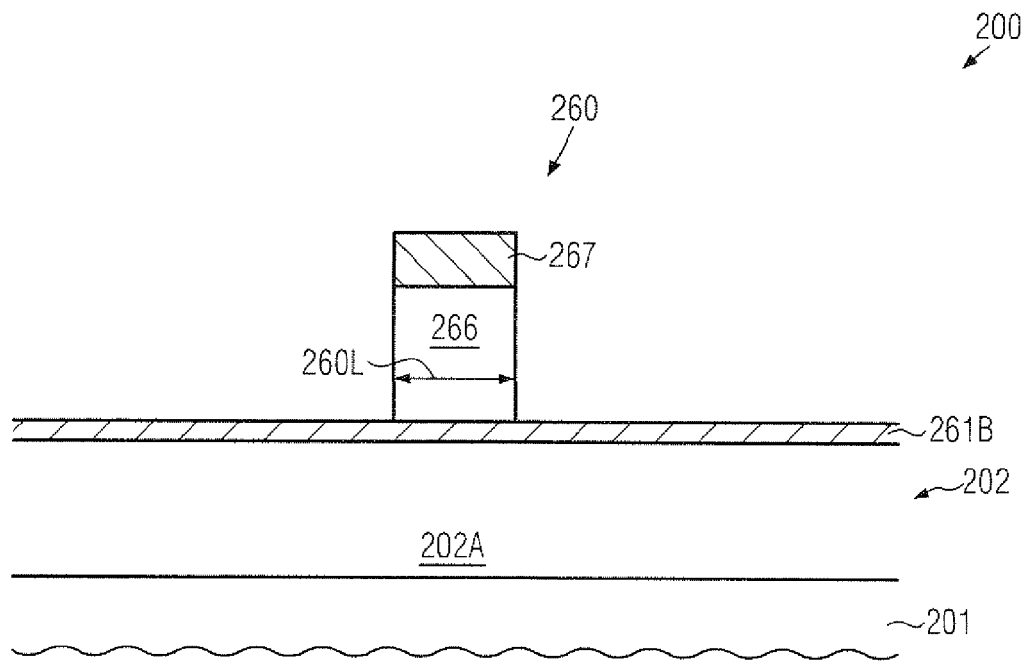
FIGS. 2a-2i schematically illustrate cross-sectional views of a semiconductor device during various manufacturing stages in forming a non-volatile storage transistor including a floating sidewall spacer as a self-aligned charge storage region on the basis of a replacement gate approach, according to illustrative embodiments.

FIG. 2a schematically illustrates a cross-sectional view of a semiconductor device 200 comprising a substrate 201 and a semiconductor layer 202. The substrate 201 and the semiconductor layer 202 may represent any appropriate device architecture, such as SOI, bulk and the like. Furthermore, any appropriate material may be used in the semiconductor layer 202 so as to form appropriate circuit elements, such as transistors and the like, therein and thereabove. Moreover, an active region or semiconductor region 202A may be provided in the layer 202, for instance on the basis of any isolation structure (not shown). An active region is to be understood herein as a semiconductor region in which one or more PN junctions are to be formed for one or more transistor elements. Consequently, the active region 202A may have a basic dopant concentration and profile as required for forming a transistor of a desired conductivity type. It should be appreciated, however, that corresponding well dopants may also be incorporated in a later manufacturing stage, if considered appropriate in view of the overall process strategy. Furthermore, a gate electrode structure 260 may be formed on the active region 202A and may comprise any appropriate material 266, which may also represent a placeholder material for a storage transistor still to be formed, while, in other cases, the material 266 may act as the actual electrode material, if required. For example, the material 266 may comprise silicon, silicon/germanium and the like. Additionally, a dielectric cap material 267, such as silicon nitride, silicon dioxide and the like, may be provided in the gate electrode structure 260. Additionally, the gate electrode structure 260 may comprise a dielectric material 261B, which may still be present in a non-patterned manner, if required. The dielectric material 261B may represent any appropriate dielectric material, such as silicon dioxide, silicon oxynitride and the like, and may have any appropriate thickness so as to appropriately isolate a charge storage region still to be formed above the active region 202A. For example, a thickness of the layer 261B may be two to several nanometers, for instance, when comprised of silicon dioxide.

The semiconductor device 200 as illustrated in FIG. 2a may be formed on the basis of any appropriate process strategy, i.e., providing the active region 202A and depositing the materials for the gate electrode structure 260, which may be subsequently patterned, at least with respect to the layers 267 and 266, by using any appropriate process technique, as is also previously discussed with reference to the device 100. It should be appreciated, however, that contrary to conventional strategies, a length 260L of the gate electrode structure 260 may be selected in accordance with superior information density and the like, since any restriction with respect to providing a charge storage region may be avoided according to the principles disclosed herein. Thus, the length 260L may be in the range of 40 nm and less in sophisticated applications.

Figure 2B:
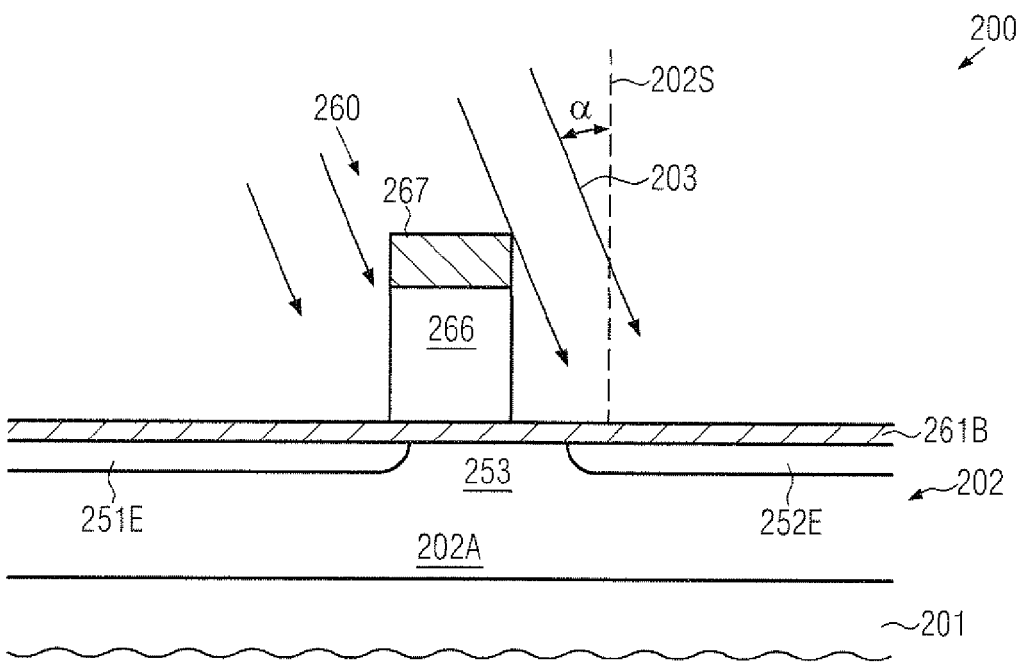

FIG. 2b schematically illustrates the semiconductor device 200 during an implantation process 203, in which drain and source dopant species may be incorporated into the active region 202A in order to form a first portion of source and drain regions, also referred to as source and drain extension regions 251E, 252E, respectively. During the implantation process 203, an appropriate tilt angle, i.e., as defined by the substantially parallel incoming ion beam and a surface normal 202S, may be selected such that the source extension region 251E may receive a certain degree of overlap with the gate electrode structure 260, while the drain extension region 252E may be laterally offset from the gate electrode structure 260. Hence, the extension regions 251E, 252E may be asymmetrically positioned with respect to the gate electrode structure 260. Appropriate tilt angles and implantation parameters may be readily determined on the basis of the required final source and drain dopant profiles and the desired degree of asymmetry by using computer simulation, experiments and the like. It should be appreciated that the gate electrode structure 260 may comprise any appropriate offset spacer (not shown), if required in this manufacturing stage.

Figure 2C:
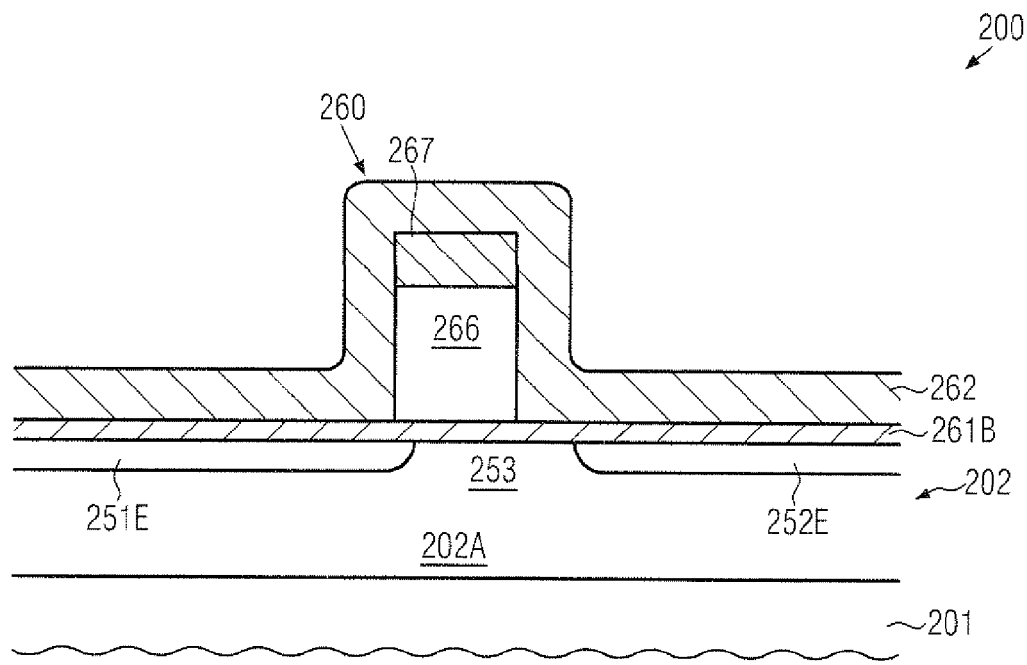

FIG. 2c schematically illustrates the device 200 in a further advanced manufacturing stage, in which a dielectric charge storage material 262 may be formed above the active region 202A and the gate electrode structure 260. The material 262 may be provided in the form of any appropriate dielectric material, such as silicon nitride and the like, which may be accomplished on the basis of well-established plasma-enhanced or thermally activated chemical vapor deposition (CVD) process techniques. Thereafter, the layer 262 may be etched on the basis of any appropriate etch recipe, wherein a plurality of selective plasma-assisted etch techniques for etching silicon nitride selectively with respect to silicon dioxide are well established and may be used for patterning the layer 262.

Figure 2D:
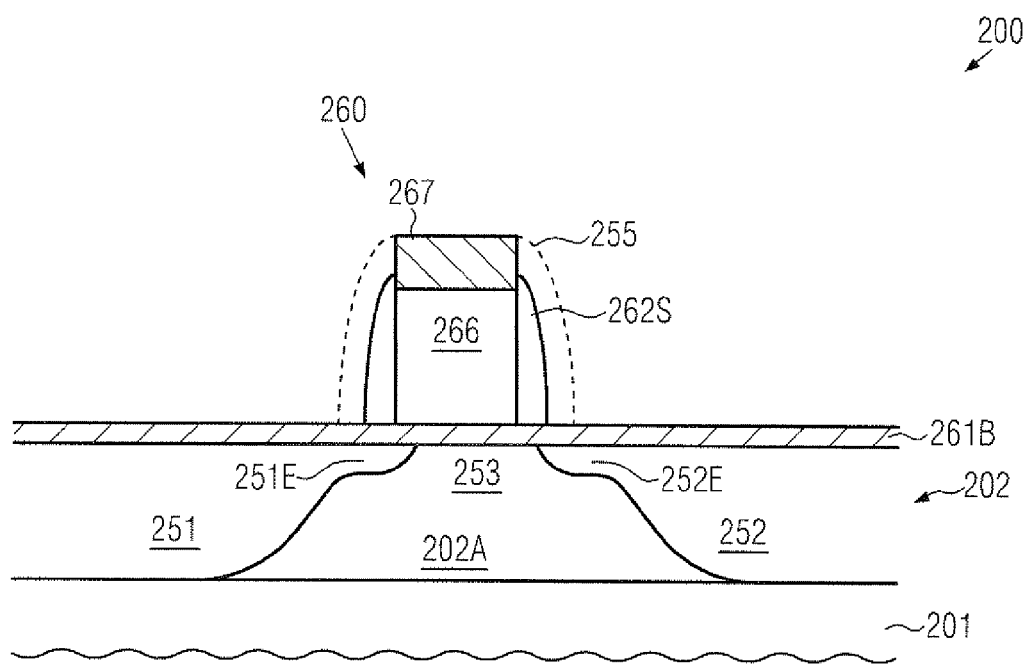

FIG. 2d schematically illustrates the semiconductor device 200 in a further advanced manufacturing stage. As illustrated, a spacer 262S may be formed on sidewalls of the gate electrode 266, wherein a size thereof may be substantially determined by the thickness of the initial layer 262 (FIG. 2c) and the etch parameters used for patterning this layer. For example, in some illustrative embodiments, the spacer 262S, which may act a self-aligned charge storage region, as will be explained later on in more detail, may have a width that may be appropriate for forming drain and source regions 252, 251 with an appropriate lateral and vertical profile, while, in other cases, an additional sidewall spacer structure 255 may be provided, for instance in the form of a silicon nitride material, possibly in combination with a silicon dioxide liner, in order to provide an increased lateral offset during a corresponding implantation sequence for forming the drain and source regions 252, 251 so as to appropriately connect to the corresponding extension regions 252E, 251E. The final dopant profile may be adjusted on the basis of any appropriate anneal technique, thereby also activating the incorporated dopant species and re-crystallizing, at least partially, any implantation-induced damage. Consequently, the source extension region 251E may have a desired overlap with the gate electrode 266, while the drain extension region 252E may overlap with the spacer 262S, which is thus positioned above a portion of the channel region 253 and a portion of the drain extension region 252E. Consequently, the spacer 262S may be positioned so as to influence the current flow through the channel region 253 upon incorporating charge carriers therein, as will be described later on in more detail. On the other hand, the spacer 262S is separated from the channel region 253 and the drain extension region 252E by the dielectric material 261B.

Figure 2E:
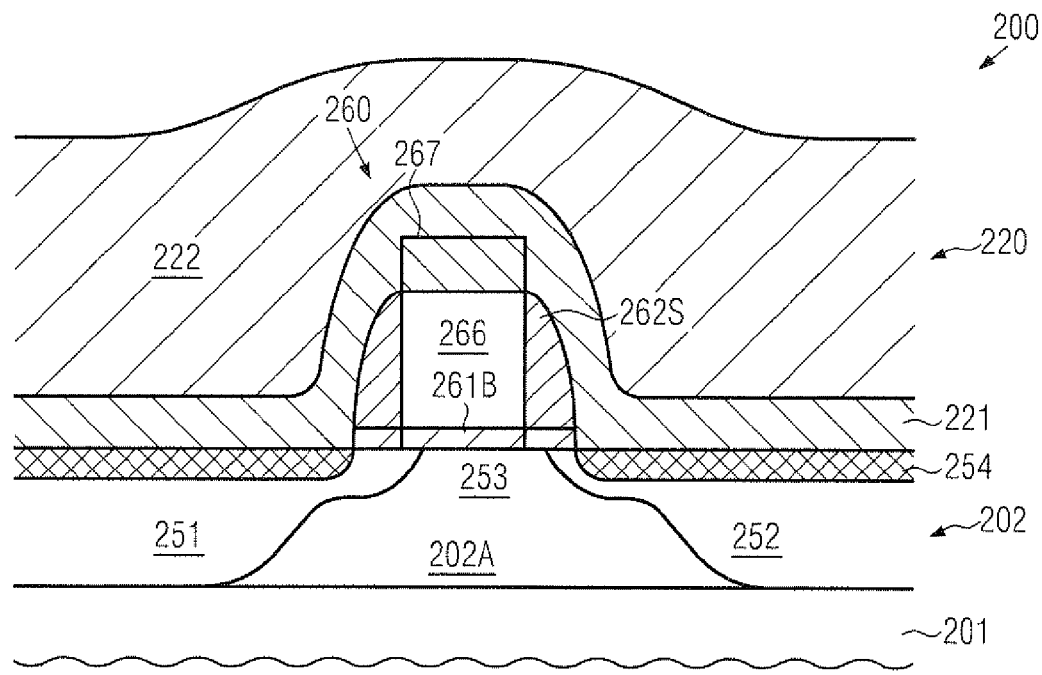

FIG. 2e schematically illustrates the device 200 in a further advanced manufacturing stage, in which a portion of a contact structure 220 may be provided above the active region 202A and the gate electrode structure 260. For example, the structure 220 may comprise any appropriate dielectric material or materials, such as a material 221, for instance provided in the form of silicon nitride and the like, possibly in a highly stressed state, followed by a further dielectric material 222, such as a silicon dioxide material and the like. Moreover, if required, contact areas in the form of metal silicide regions 254 may be provided in the drain and source regions 252, 251, while the gate electrode 266 may comprise still at least a portion of the dielectric cap material 267.

The metal silicide regions 254 and the dielectric materials 221, 222 may be provided on the basis of any appropriate process strategy. It should be appreciated that additional materials, such as etch stop materials and the like, may be provided together with the materials 221 and 222, if required, for instance for providing differently stressed dielectric materials in different device areas and the like.

Figure 2F:
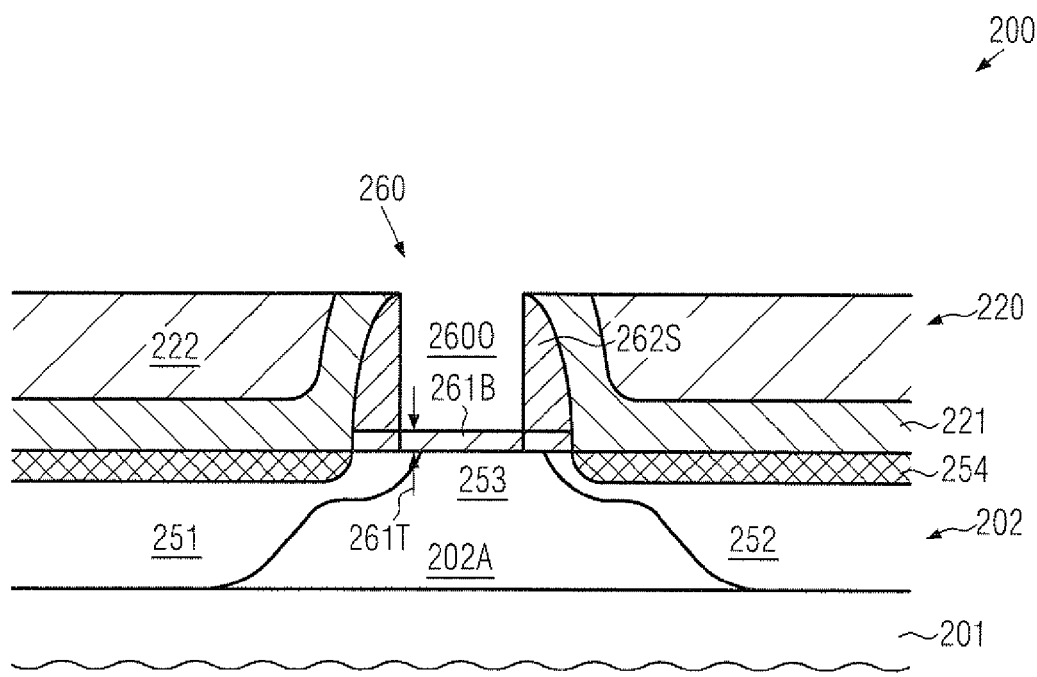

FIG. 2f schematically illustrates the device 200 in a further advanced manufacturing stage, in which the materials 221 and 222 are planarized so as to expose a top surface of the placeholder material 266 (FIG. 2e), which may then be removed on the basis of any appropriate selective etch technique. For example, a plurality of wet chemical and plasma-assisted etch recipes are available for removing a plurality of materials, such as silicon, with respect to dielectric materials, such as silicon nitride, silicon dioxide and the like. Consequently, during the corresponding etch process, a gate opening 260O may be formed in the gate electrode structure 260, wherein the material 261B may act as an efficient etch stop material. If desired, the initial thickness 261T of the material 261B, which may be appropriately selected so as to efficiently separate the spacer 262S from the drain region 252 and the channel region 253, may be reduced within the opening 260O, for instance by using any well-controllable etch techniques, such as hydrofluoric acid and the like. In other cases, the exposed portion of the material 261B may be substantially completely removed, for instance by plasma-assisted etch processes in combination with wet chemical etch processes and the like, if considered appropriate for the further processing of the device 200 and the resulting device characteristics.

Figure 2G:
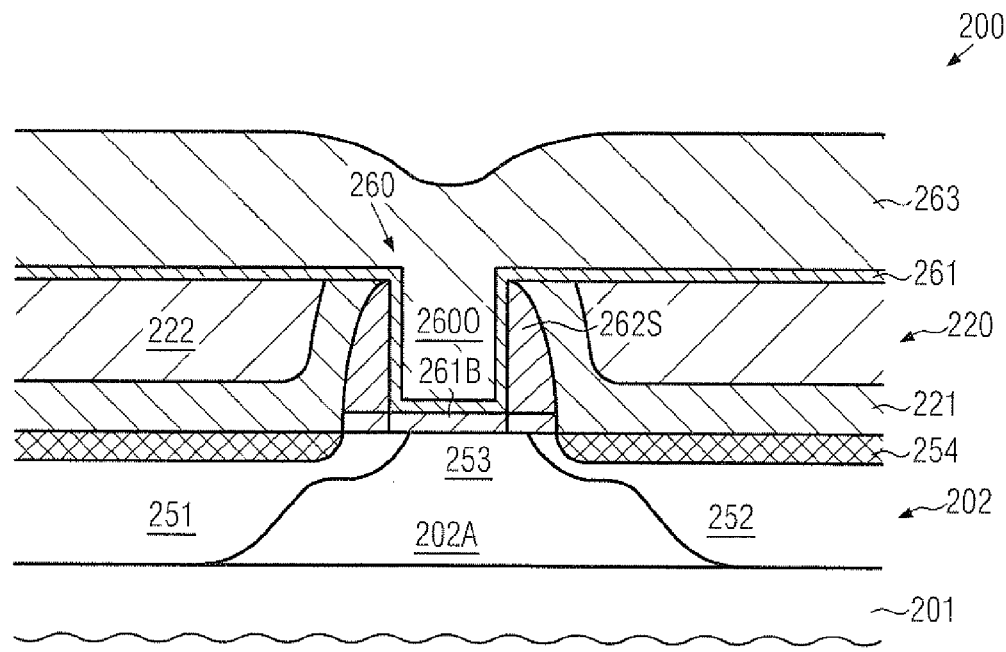

FIG. 2g schematically illustrates the semiconductor device 200 in a further advanced manufacturing stage. As illustrated, a gate dielectric material 261 may be formed within the opening 260O, thereby separating an electrode material 263 from the channel region 253. Furthermore, as previously discussed, a portion of the material 261B or all of the material 261B may also be present and may act in combination with the material 261 as a gate insulation layer of the gate electrode structure 260. In other cases, a corresponding conventional dielectric material may be newly formed, for instance by oxidation and the like, if considered appropriate. On the other hand, the material 261 is formed so as to be in contact with the sidewall spacers 262S, thereby electrically insulating the spacers 262S from the electrode material 263. In some illustrative embodiments, the material 261 may comprise a high-k dielectric material, such as a hafnium oxide based material, a zirconium oxide based material and the like, which may typically have a higher dielectric constant compared to conventional dielectric materials, such as silicon dioxide, silicon nitride and the like. The electrode material 263 may be comprised of any material or material layers in order to obtain the desired high conductivity and the threshold voltage, for instance by providing an appropriate work function adjusting material in the layer 263, as may be appropriate for the gate electrode structure 260. For instance, titanium nitride, tantalum nitride, aluminum, lanthanum and the like may represent appropriate candidates for materials to be used in the electrode layer 263. Typically, the dielectric material 261 may be deposited on the basis of a conformal deposition technique, such as atomic layer deposition (ALD), which represents a self-limiting CVD-like deposition technique, or any other process technique. Similarly, the material 263 may be provided by CVD-like deposition techniques, sputter deposition, electrochemical deposition or any combination thereof.

Figure 2H:
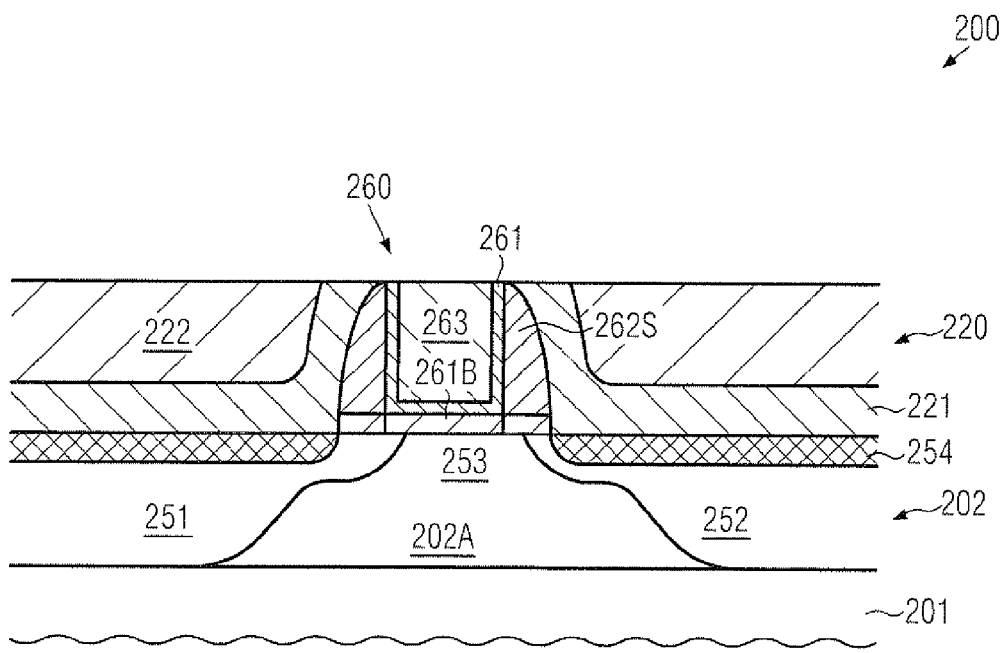

FIG. 2h schematically illustrates the semiconductor device 200 in a further advanced manufacturing stage, i.e., after the removal of any excess material, thereby providing the gate electrode structure 260 so as to comprise a gate electrode 263, i.e., the remaining material of the layer 263 of FIG. 2g, and the dielectric material 261, which, in combination with the material 261B, may represent the gate dielectric material of the gate electrode structure 260. Moreover, the layer 261 may separate the gate electrode 263 from the spacer 262S, which in turn is separated by the material 261B from the channel region 253 and the drain region 252. It should be appreciated that any appropriate process strategy, such as chemical mechanical polishing CMP) and the like, may be applied in order to obtain the device 200 as shown in FIG. 2h.

Figure 2I:
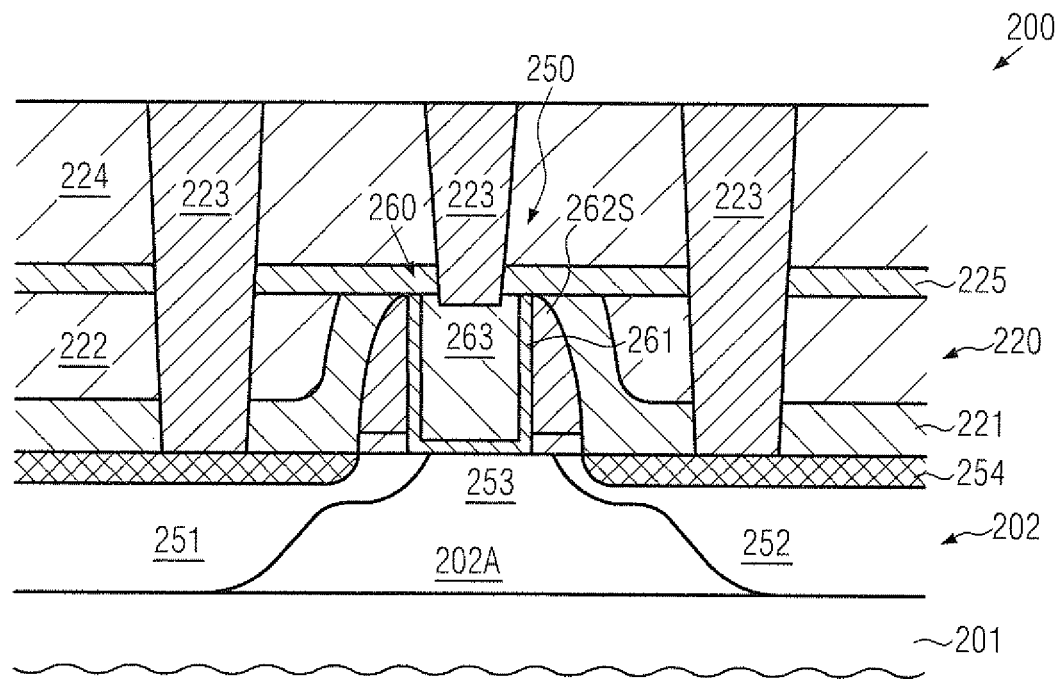

FIG. 2*i* schematically illustrates the semiconductor device 200 in a stage in which the contact structure 220 may be completed and may comprise contact elements 223 so as to connect to the transistor 250. For example, the contact structure 220 may comprise an additional dielectric material 224, possibly in combination with an etch stop material 225 which may be provided in the form of any appropriate dielectric materials. Thus, contact elements 223 may connect to the drain and source regions 252, 251 and also to the gate electrode structure 260, i.e., to the gate electrode 263. Any appropriate process strategy may be applied for forming the contact structure 220 as shown in FIG. 2*i*, wherein sophisticated lithography strategies may be applied due to the reduced lateral dimension of the transistor 250, which is no longer restricted by the incorporation of an embedded charge storage region to be formed on the basis of lithography processes.

Consequently, the spacer 262S at the drain site, i.e., formed above the channel region 253 and the drain region 252, may act as a self-aligned charge storage region, which may exchange charge carriers with the gate electrode 263 through the dielectric material 261, while an injection of hot charge carriers from the channel region 253 into the spacer 262S for programming and erasing the transistor 250 may be substantially avoided, as will be discussed later on.

Figure 2J:
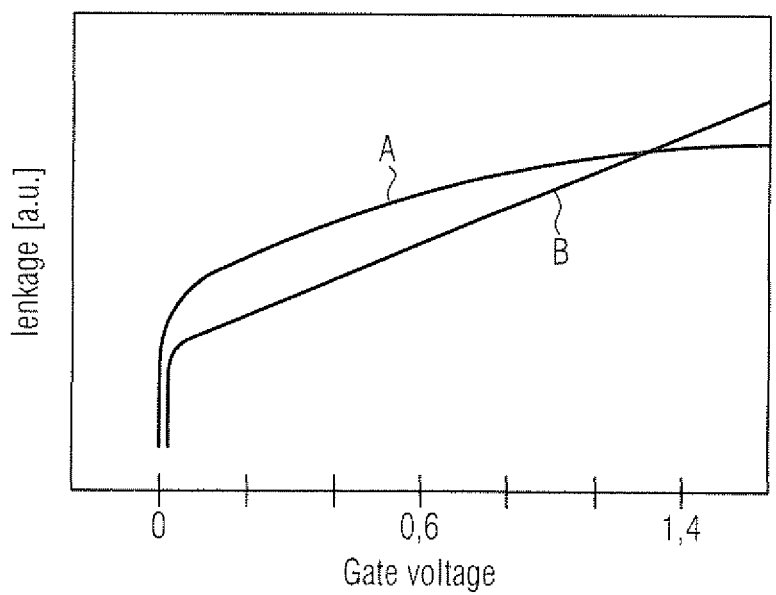
FIG. 2j schematically illustrates a graph representing the leakage current behavior of a conventional dielectric material and a high-k dielectric material.

FIG. 2*j* illustrates the leakage behavior of a high-k dielectric material, represented by curve B, versus the leakage behavior of a conventional dielectric material, such as silicon dioxide, represented by curve A, in a very schematic manner. As illustrated, the horizontal axis represents the gate voltage, i.e., a voltage supplied to the gate electrode and the drain or source of a corresponding transistor, while the vertical axis may represent the resulting leakage current in arbitrary units. As shown, for moderately low gate voltages, which may represent the operating voltages of sophisticated transistors in a normal operating mode, the leakage current of a conventional gate dielectric material, i.e., curve A, may be significantly higher compared to a high-k dielectric material, i.e., curve B, such as hafnium oxide. It should be appreciated that the corresponding thickness values of these materials may be selected so as to obtain the same oxide equivalent thickness. Thus, as expected, for normal operating voltages, the high-k dielectric material may exhibit a superior performance. On the other hand, at higher voltages, for instance, in the example shown, above approximately 1.4 volts, the leakage current of the high-k dielectric material may increase and may be higher compared to the conventional dielectric material. Consequently, this effect may, in some illustrative embodiments, be advantageously exploited so as to initiate leakage currents through a high-k dielectric material at a reduced voltage compared to a conventional dielectric material, thereby enabling applying reduced programming voltages and erasing voltages, as will be described later on.

Figure 1B:
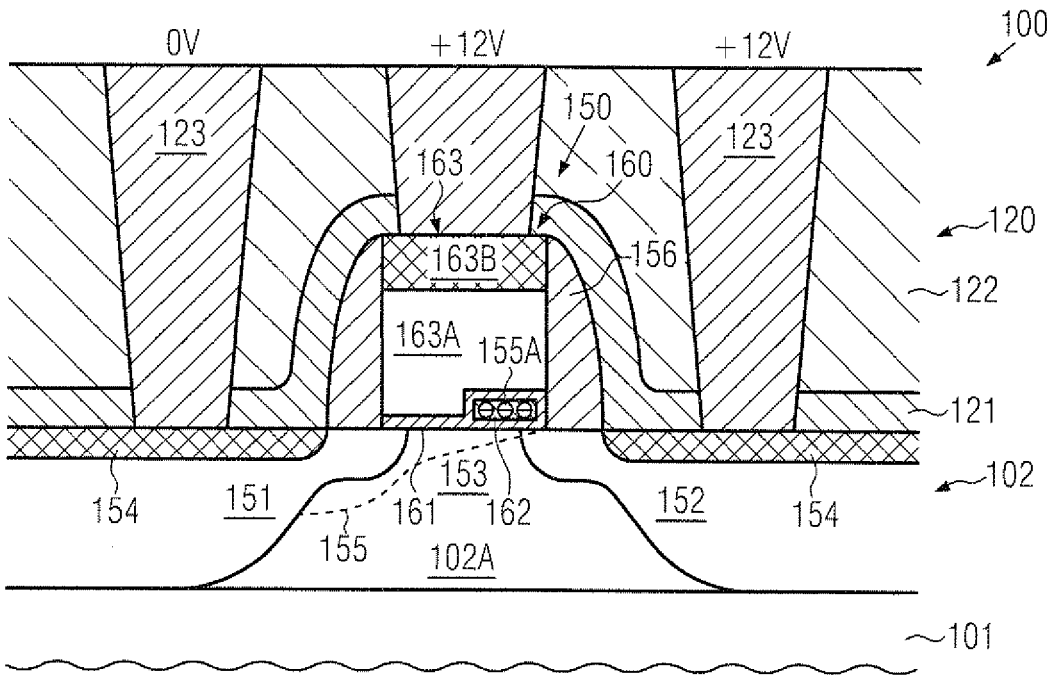
FIGS. 1b-1e schematically illustrate cross-sectional views of the transistor during various operating modes in programming and erasing the storage transistor, according to conventional strategies.
Figure 1C:
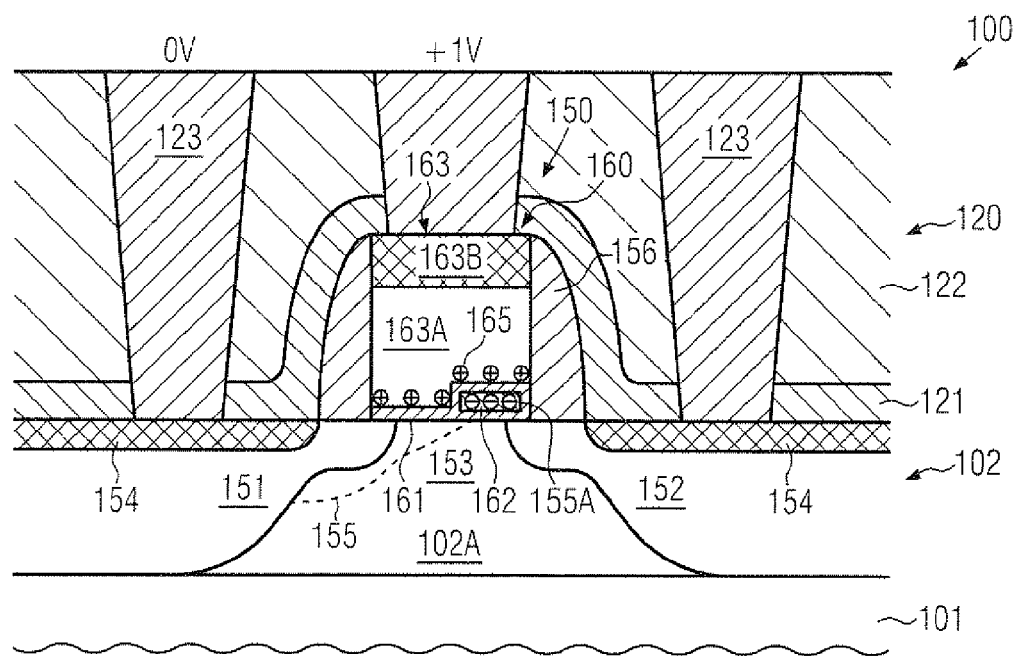
Figure 1D:
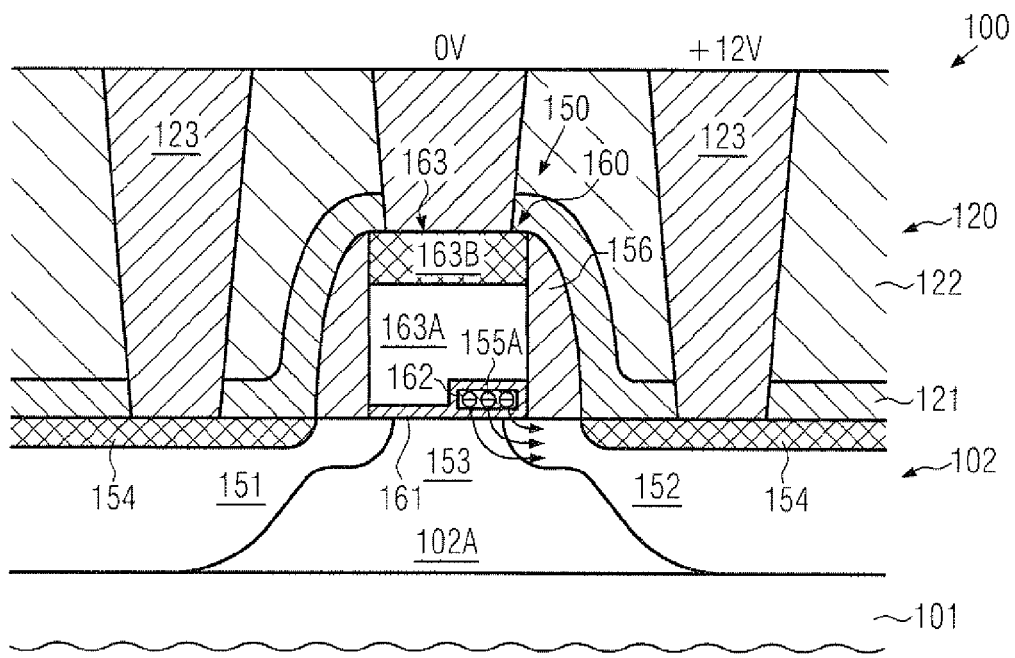
Figure 1E:
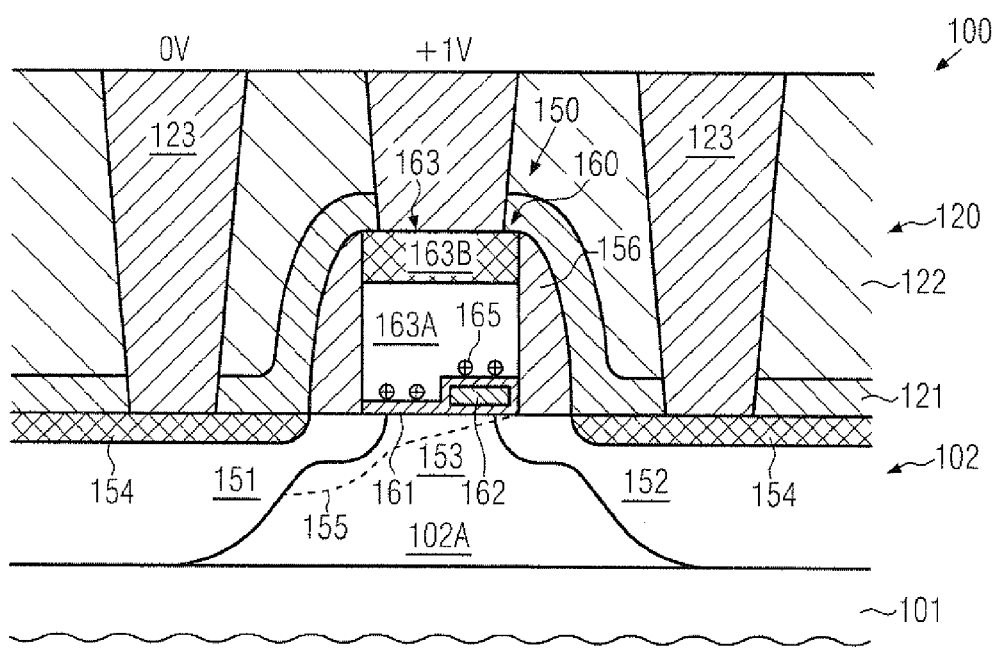
Figure 2K:
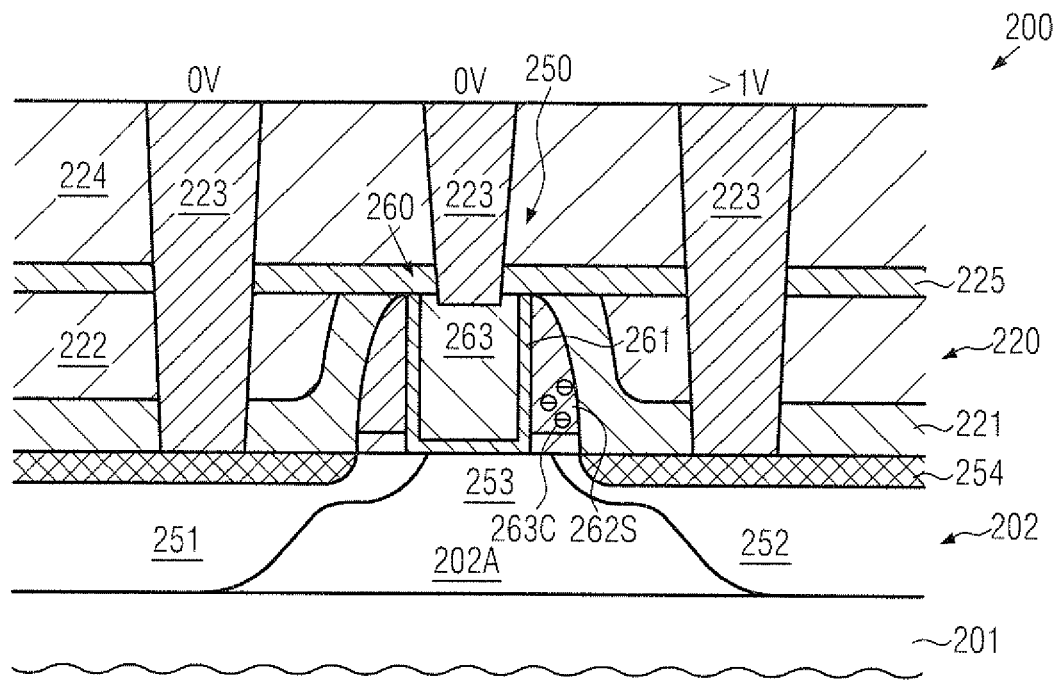
FIGS. 2k-2n schematically illustrate cross-sectional views of the storage transistor during various operating modes for programming and erasing an N-channel transistor on the basis of reduced voltages, according to illustrative embodiments.

FIG. 2*k* schematically illustrates a procedure for programming the transistor 250, when representing an N-channel transistor, on the basis of a superior programming strategy compared to conventional procedures, as, for instance, described with reference to FIG. 1*b*. As illustrated, a moderately high voltage may be applied to the drain 252, which, however, may be significantly lower compared to conventional programming voltages. For example, a voltage above 1 volt and less than approximately 5 volts may be applied, while the source 251 and the gate electrode 263 are held at the lower supply voltage, i.e., 0 volts. Due to the increased programming voltage, charge carriers 263C may be transferred from the gate electrode 263 into the floating spacer 262S and may thus be accumulated therein, thereby providing the stationary charge in the spacer 262S.

Figure 2L:
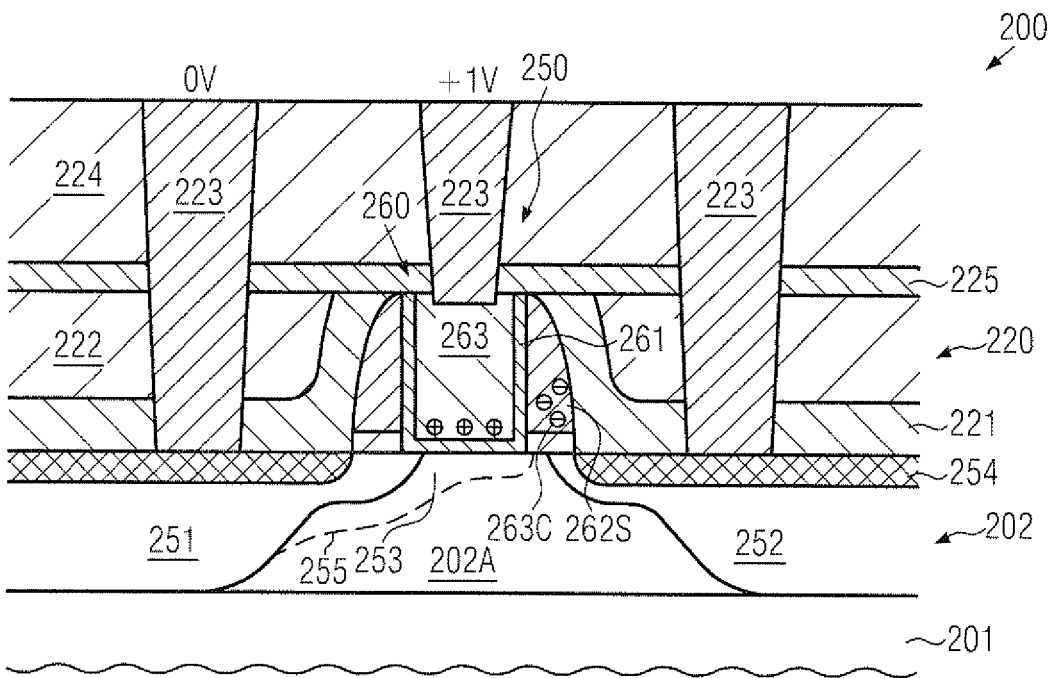

FIG. 2*l* schematically illustrates the semiconductor device 200 in a normal operating mode, when transistor 250 is in a programmed state, i.e., when charge carriers 263C are positioned within the floating spacer 262S. In this case, the normal operating voltage, for instance +1 volt, is applied to the gate electrode 263, while the source 251 is held at the lower supply voltage. In this case, a conductive channel 255 may build up starting from the source region 251 due to the positively pre-charged gate electrode 263, while, however, the negative charges 263C in the spacer 262S may result in an efficient interruption or pinch off of the channel 255, thereby resulting in a high impedance state of the transistor 250.

Figure 2M:
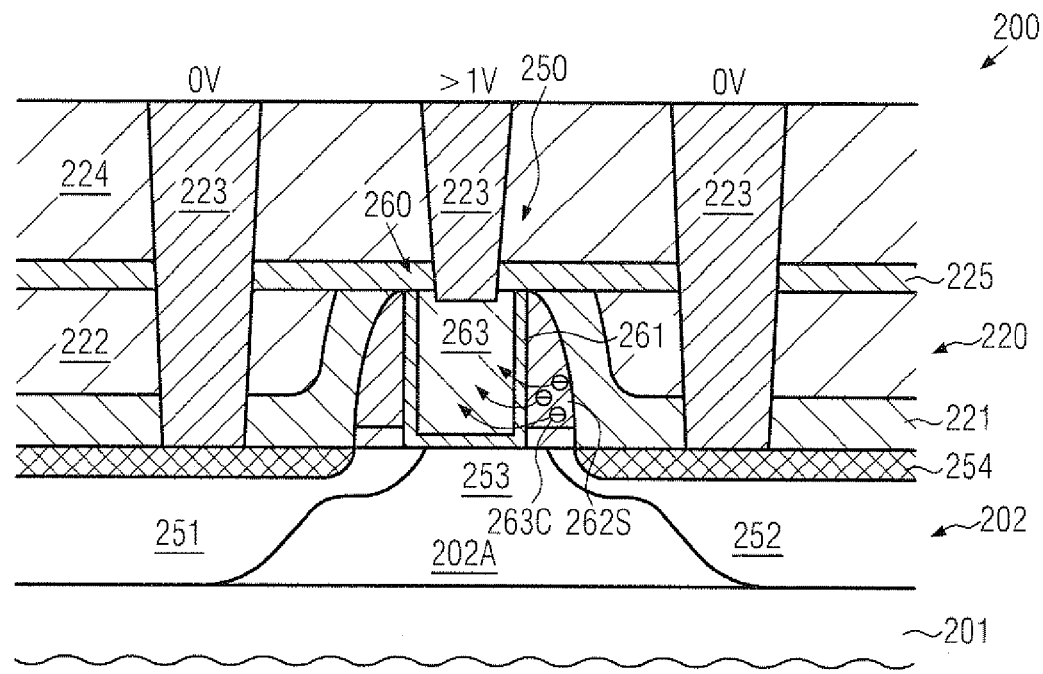

FIG. 2*m* schematically illustrates the device 200 during an erase mode, in which a moderately high erase voltage, for instance a voltage above 1 volt, is applied to the gate electrode 263, while the drain and source regions 252, 251 are held at the lower supply voltage. Consequently, the charge carriers 263C may channel through the gate dielectric material 261 into the electrode 263.

Figure 2N:
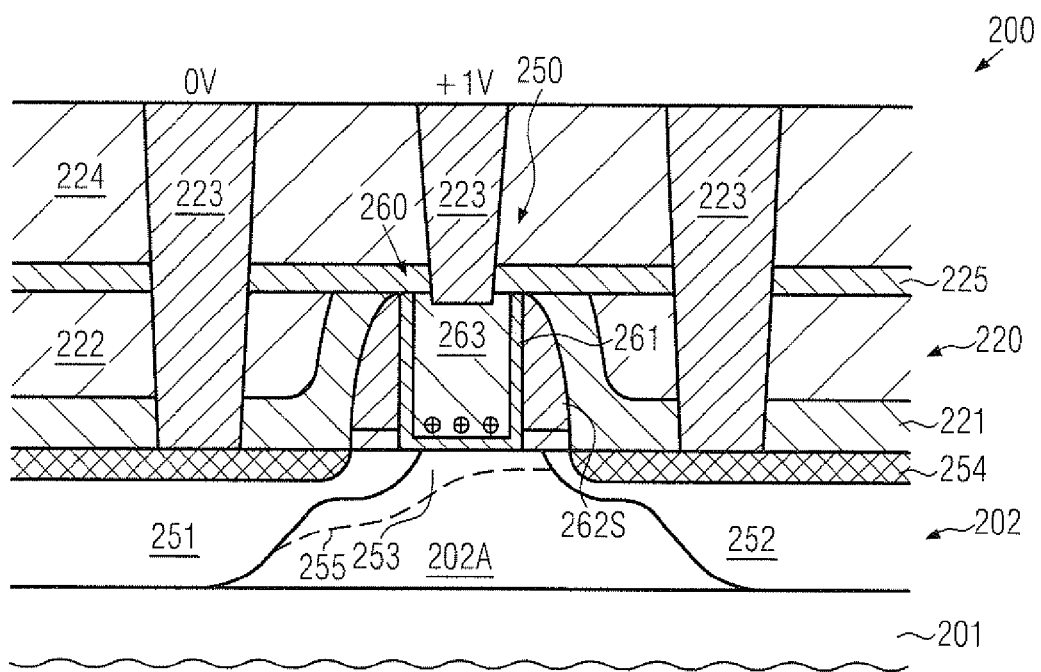

FIG. 2*n* schematically illustrates the semiconductor device 200 in the normal operating mode, when the transistor 250 is in the erased or non-programmed state, i.e., charge carriers have been removed from the floating spacer 262S. In this case, the conductive channel 255 may build up from the source region 251 via the channel region 253 and may connect to the drain region 252 due to the lack of the negative excess charge in the spacer 262S.

Consequently, based on the above programming and erasing procedure, the transistor 250 may be bought into a low impedance state and high impedance state, as required for a memory cell, which may be accomplished on the basis of moderately low programming and erasing voltages compared to conventional strategies.

Figure 2O:
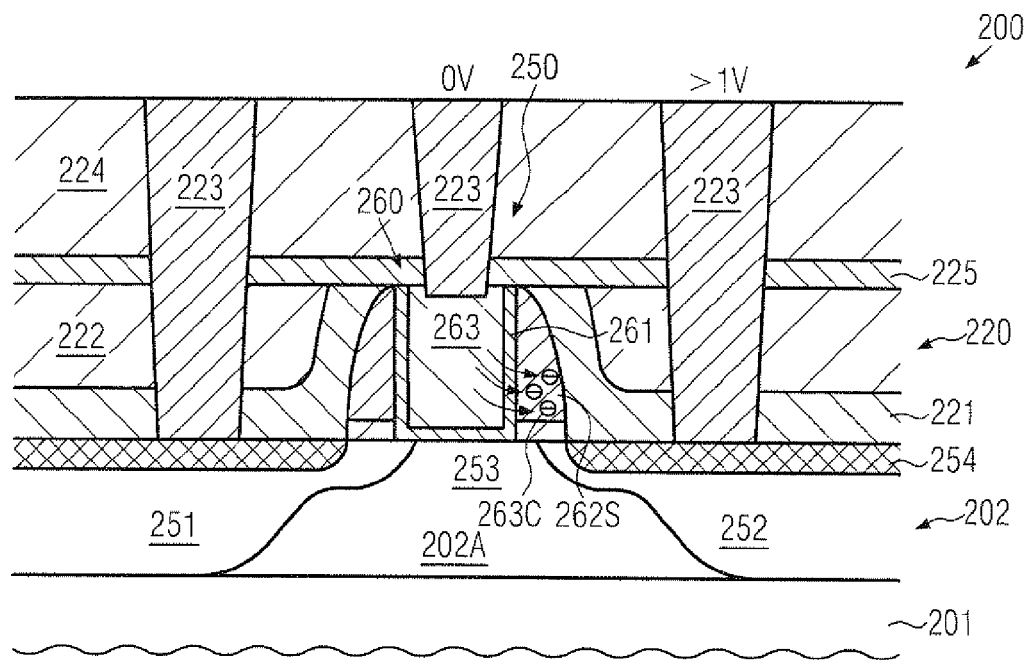
FIGS. 2o-2r schematically illustrate cross-sectional views of the semiconductor device, when a P-channel transistor is programmed and erased on the basis of reduced voltages, according to further illustrative embodiments.

FIG. 2*o* schematically illustrates the device 200 during a programming phase, when the transistor 250 represents a P-channel transistor. In this case, a moderately high programming voltage of, for instance, above one volt, depending on the characteristics of the dielectric material in the gate electrode structure 260, may be applied to the drain region 252, while the gate electrode 263 is kept at the low supply voltage. Consequently, as explained above, the excess charge carriers 263C may be transferred into the floating spacer 262S.

Figure 2P:
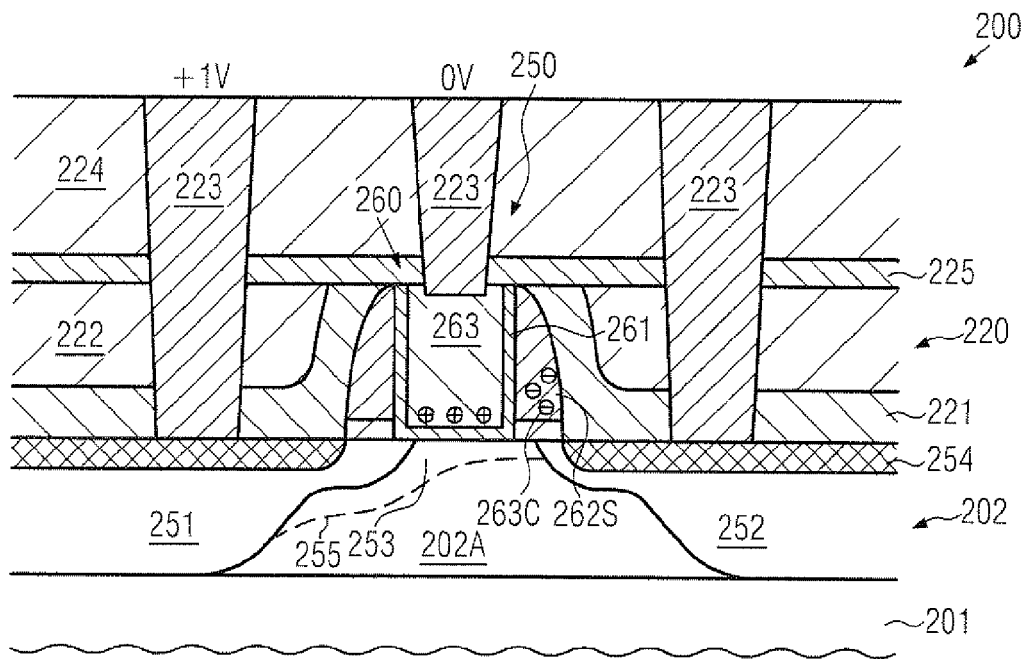

FIG. 2*p* schematically illustrates the device 200 during the normal operating mode, i.e., the supply voltage of, for instance, +1 volt is applied to the source region 251, while the gate electrode 263 is connected to the low supply voltage. Consequently, a conductive channel 255 may build up and may, due to the presence of the negative excess charge 263C within the floating spacer 262S, connect to the drain region 252, thereby providing a low impedance state.

Figure 2Q:
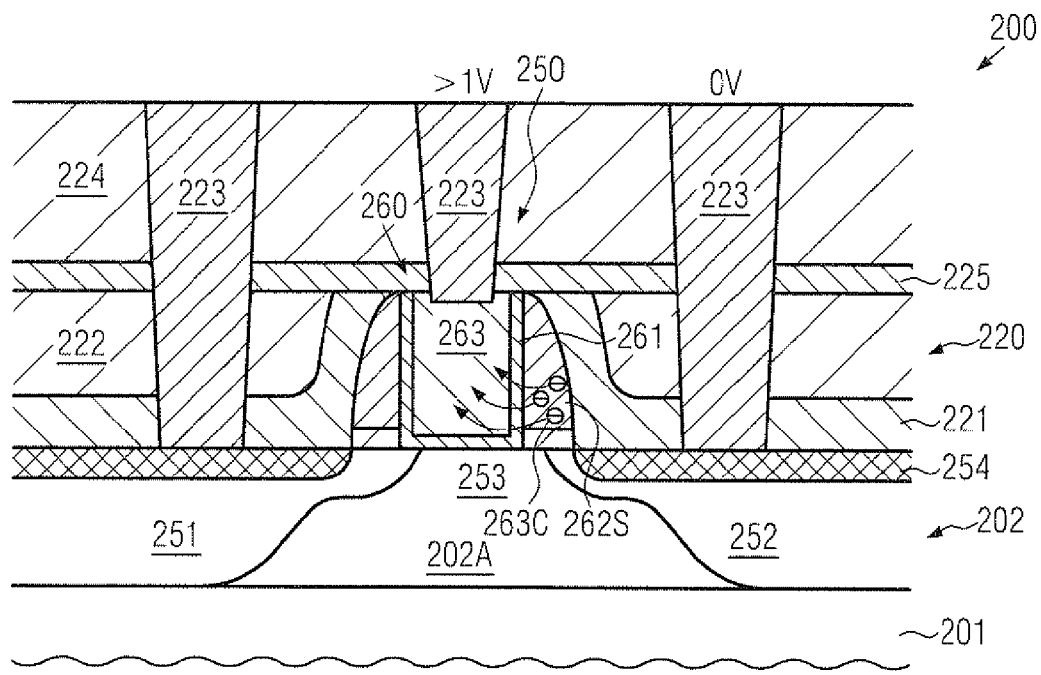

FIG. 2*q* schematically illustrates the device 200, when erasing the transistor 250, whereby the erasing voltage of, for instance, more than one volt is applied to the gate electrode 263, while the drain region 252 is connected to the low supply voltage. Consequently, at least the most part of the excess charge 263C may be transferred into the gate electrode 263.

Figure 2R:
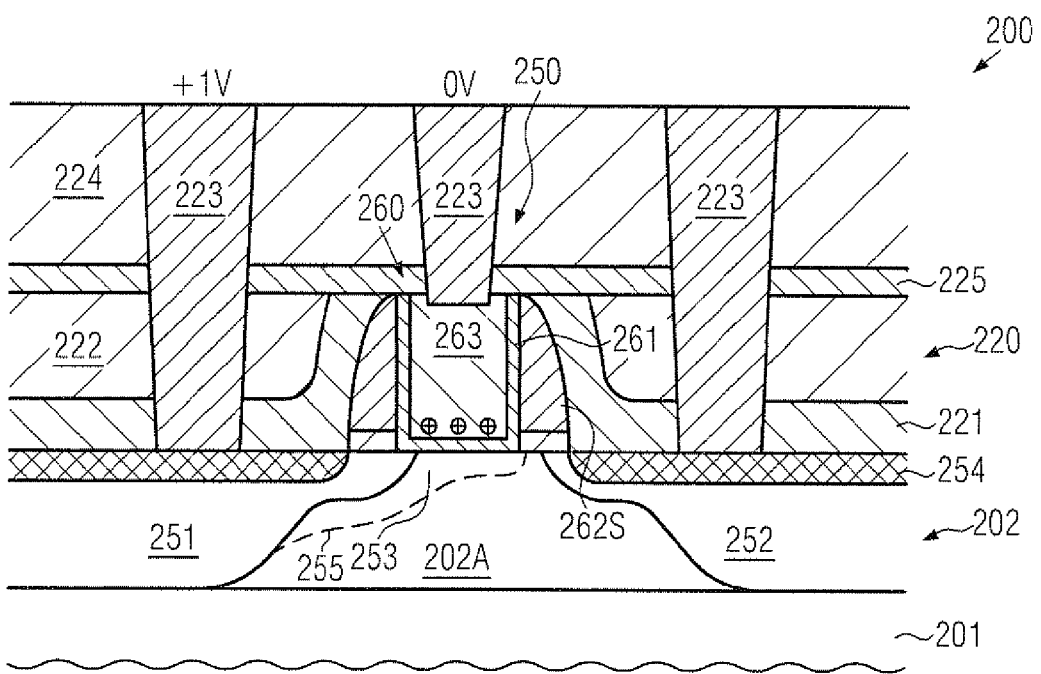

In FIG. 2*r*, the normal operating mode of the device 200 is illustrated, after erasing the transistor 250. In this case, the conductive channel 255 may not connect to the drain region 252 due to the lack of sufficient excess charge in the floating spacer 262S, thereby resulting in a high impedance state.

Consequently, P-channel transistors and N-channel transistors may be efficiently used as non-volatile storage transistors, wherein reduced dimensions may be implemented due to the self-aligned nature of the manufacturing process. Furthermore, contrary to conventional non-volatile storage transistors, a charge transfer to and from the charge storage region may be established by means of the gate electrode rather than requiring the transition of charge carriers through the actual gate dielectric layer, thereby providing superior endurance, i.e., an increased number of write and erase cycles of the storage transistor. Moreover, the process strategy may be compatible with sophisticated replacement gate approaches in which high performance gate electrode structures may be provided in other transistor elements.

Figure 2S:
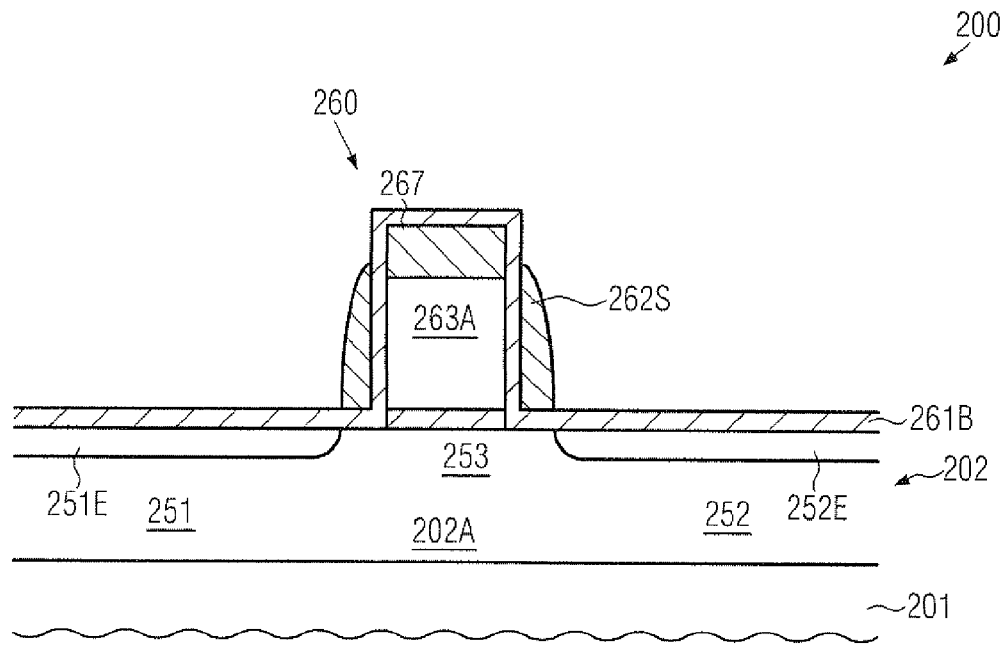
FIGS. 2s-2u schematically illustrate cross-sectional views of a semiconductor device during various manufacturing stages in providing a floating spacer element on the basis of a manufacturing regime without requiring the replacement of a gate electrode material, according to still further illustrative embodiments.
Figure 2T:
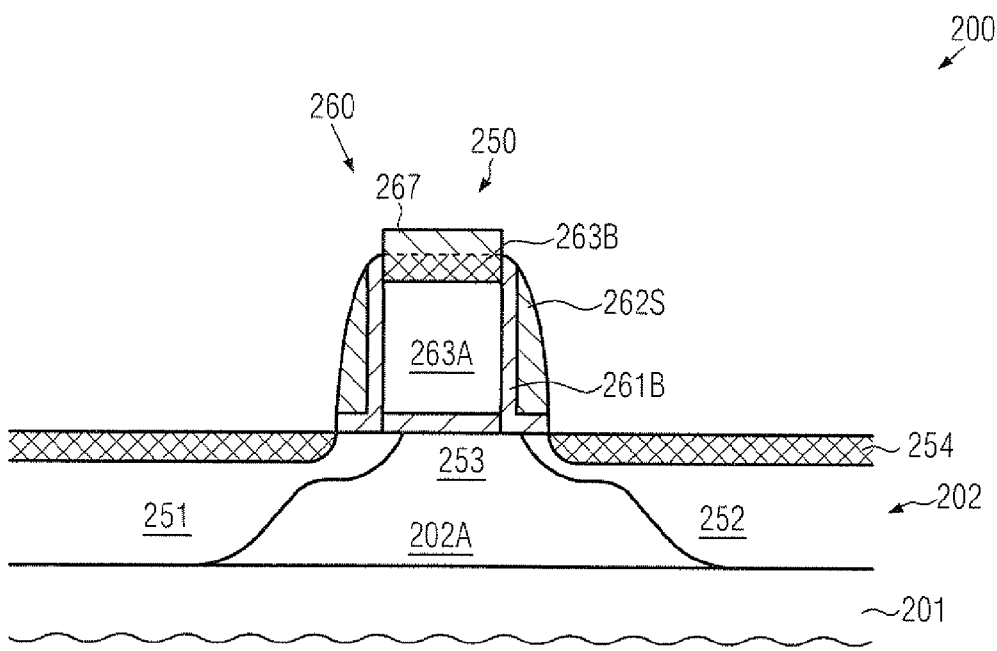
Figure 2U:
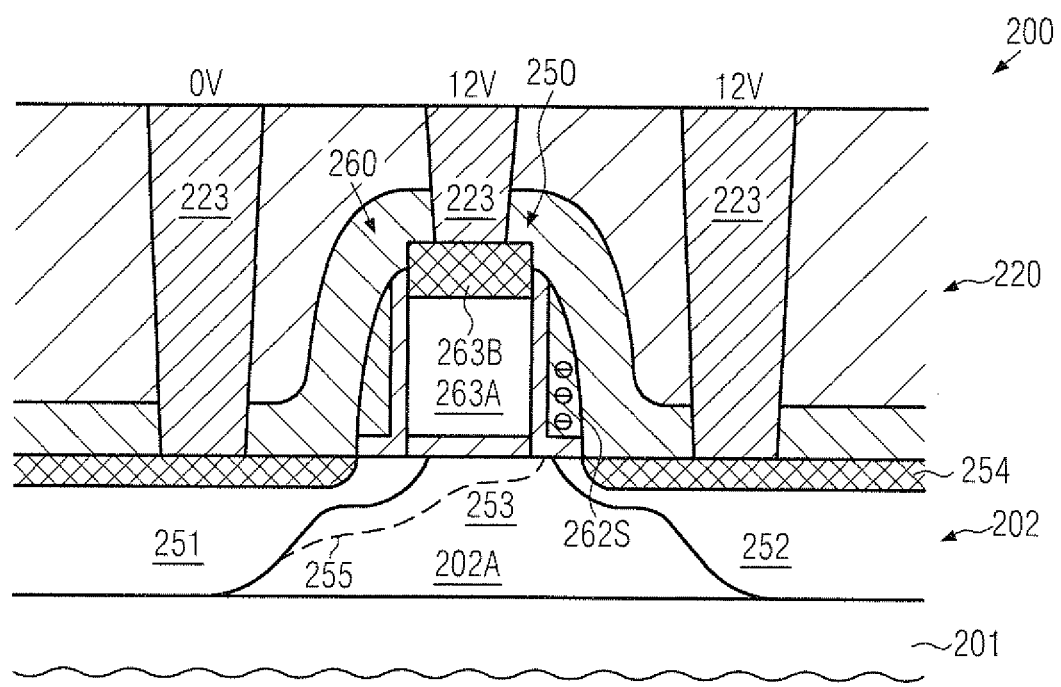

With reference to FIGS. 2s-2u, further illustrative embodiments will be described, in which the concept of a floating spacer may be applied to any appropriate gate electrode structure.

FIG. 2s schematically illustrates the semiconductor device 200 in a manufacturing stage in which the drain and source extension regions 252E, 251E are formed in the active region 202A and have an asymmetric configuration with respect to the gate electrode structure 260, which may comprise a gate dielectric material 261B, such as a material comprising a high-k dielectric material in combination with a conventional dielectric material, or the material 261B may be provided in the form of a conventional dielectric material, such as silicon oxynitride and the like. Moreover, the gate electrode structure 260 may comprise an electrode material 263A, such as a polysilicon material, possibly in combination with a metal-containing electrode material, thereby providing a high-k metal gate electrode structure if the material 261B comprises a high-k dielectric material. In other cases, the electrode material 263A may be comprised of a semiconductor material, such as polysilicon and the like. Furthermore, if required, a cap material 267 may still be provided above the material 263A, while, in other cases, the material 267 may have been removed in an earlier manufacturing phase. Furthermore, the floating sidewall spacer 262S is formed on the sidewalls of the gate electrode structure 260 in combination with an appropriate dielectric material 261B, such as a silicon dioxide material, having an appropriate thickness so as to appropriately act as a charge transfer layer, as is also previously discussed when referring to the conventional semiconductor device 100.

It should be appreciated that the device 200 as illustrated in FIG. 2s may be formed on the basis of similar process techniques described above, for instance for providing the extension regions 251E, 252E, while the gate electrode structure 260 may be formed in accordance with any appropriate process strategy in order to obtain the desired electrical performance and gate length. For example, a high-k dielectric material in combination with a metal-containing electrode material may be provided in an early manufacturing stage in combination with a silicon material, while, in other cases, a conventional electrode structure may be provided, however, without being restricted in the lateral dimensions by sophisticated lithography process due to the self-aligned nature of the spacer 262S.

FIG. 2t schematically illustrates the device 200 in a further advanced manufacturing stage. As illustrated, the transistor 250 may comprise the drain and source regions 252, 251 including metal silicide regions 254. Furthermore, in some illustrative embodiments, a metal silicide 263B may also be formed in the electrode material 263A, which may be accomplished by removing the cap layer 267 prior to performing a corresponding silicidation process. Thus, as previously explained, the floating spacer 262S may be positioned above a portion of the channel region 253 and the drain region 252 and may be separated from the gate electrode 263A and the regions 253, 252 by the dielectric material 261B. It should be appreciated that a height of the spacer 262S may be appropriately reduced, for instance upon forming the spacer, so as to avoid any contact with the metal silicide region 263B.

FIG. 2u schematically illustrates the device 200 in a further advanced manufacturing stage. As shown, the contact structure 220 may be provided and may have a similar configuration as is, for instance, illustrated in FIG. 1a when referring to the conventional storage transistor. Furthermore, the transistor 250 may be illustrated in a stage in which excess charge may be accumulated in the floating spacer 262S during a programming procedure, which may be performed on the basis of a conventional strategy, for instance by applying a high voltage, such as 12 volts, to the gate electrode 263A, 263B and to the drain region 252, when the transistor 250 represents an N-channel transistor. Consequently, upon building up the conductive channel 255 in the channel region 253, hot charge carriers may be transferred into the spacer 262S, as is also previously explained with reference to the device 100. Similarly, upon erasing the transistor 250, the excess charge may be drained off via the drain region 252, as previously discussed. Consequently, a conventional programming and erasing strategy may be applied, while nevertheless a high degree of flexibility in designing the gate electrode structure 260 may be achieved, for instance in terms of material composition and in particular in terms of lateral dimensions due to the self-aligned nature of the floating spacer 262S.

Figure 3A:
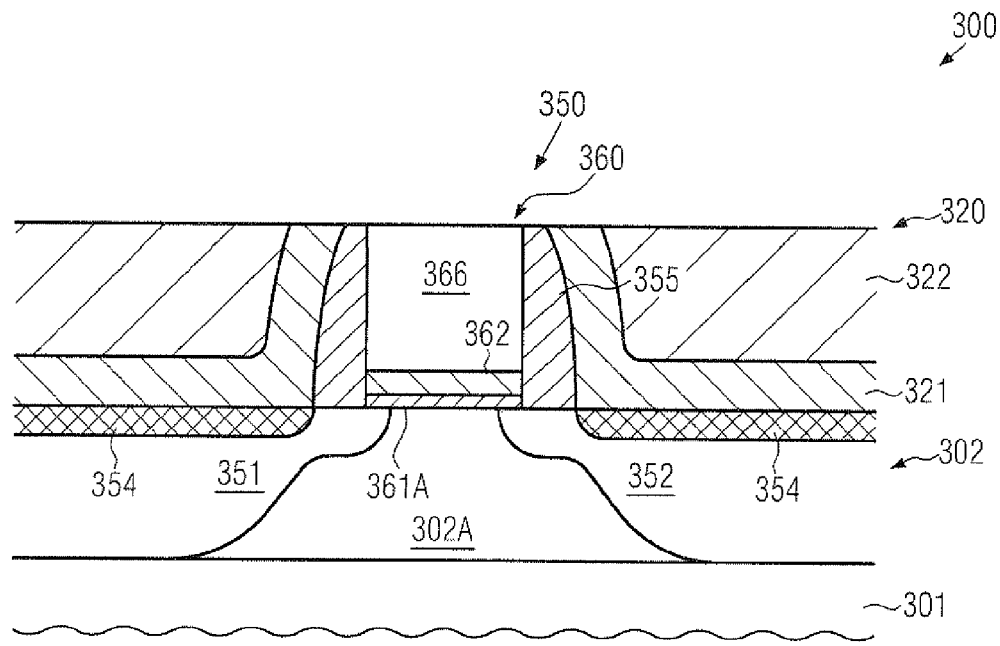
FIGS. 3a-3f schematically illustrate cross-sectional views of a semiconductor device during various manufacturing stages, in which a charge storage material may be patterned in a self-aligned manner, i.e., without requiring a lithography process, during a replacement gate approach within a gate opening, according to illustrative embodiments.
Figure 3B:
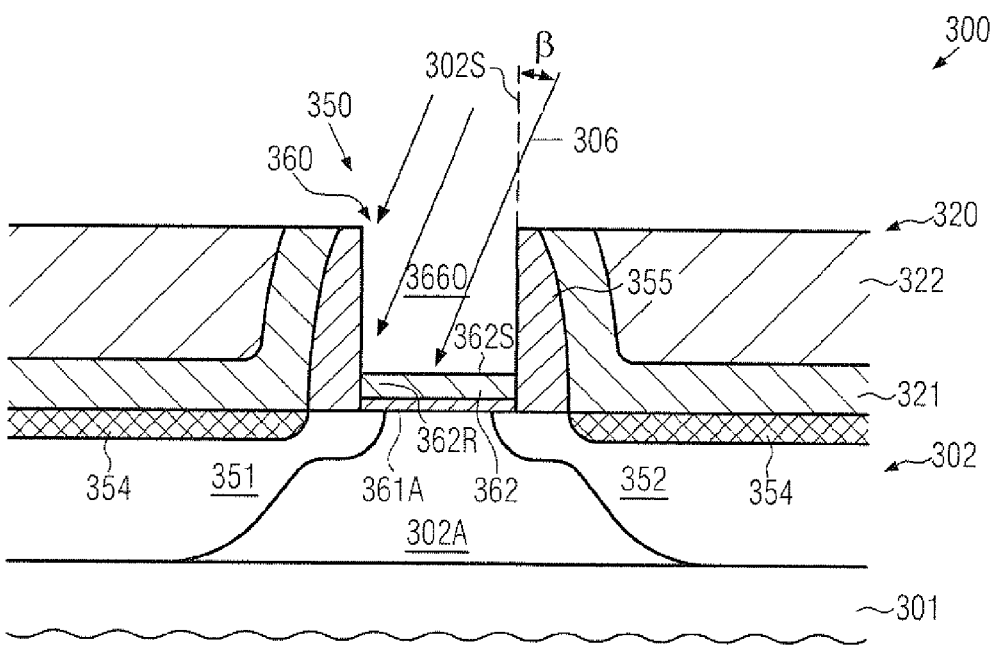
Figure 3C:
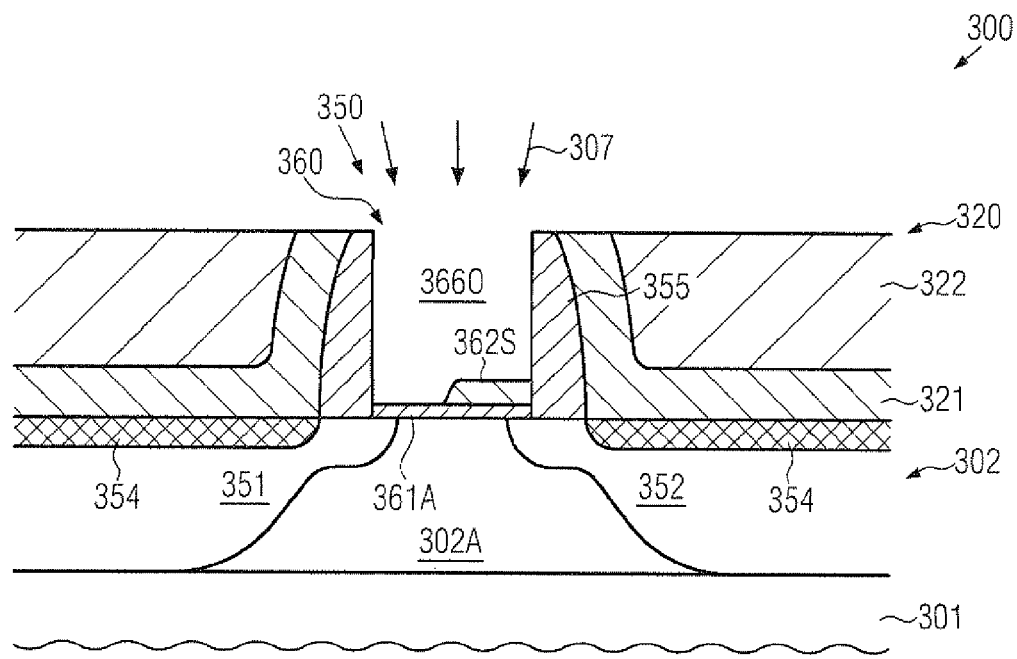
Figure 3D:
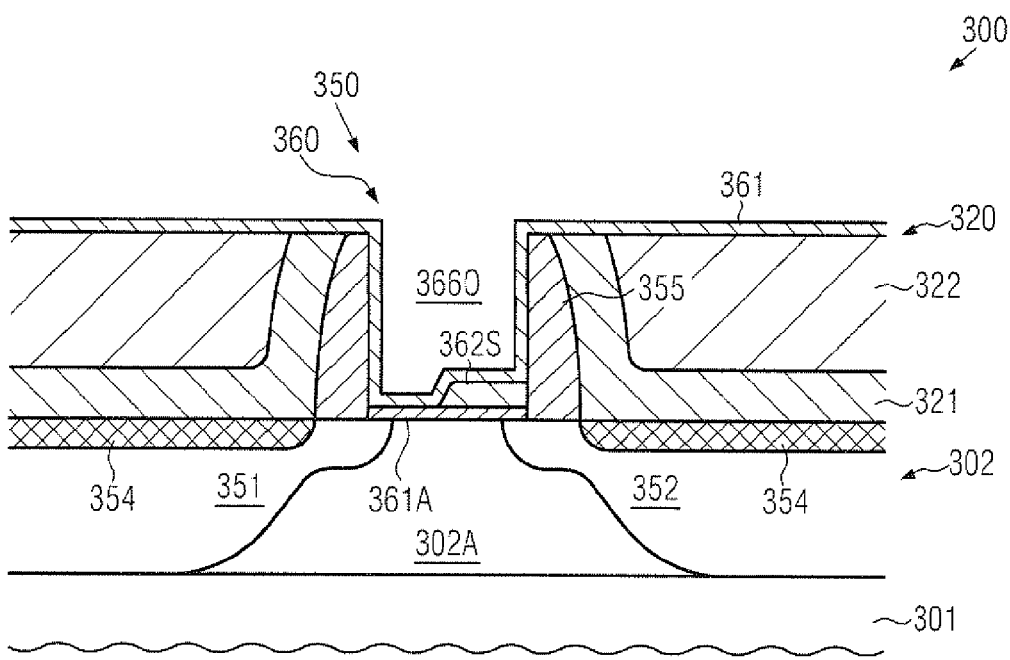
Figure 3E:
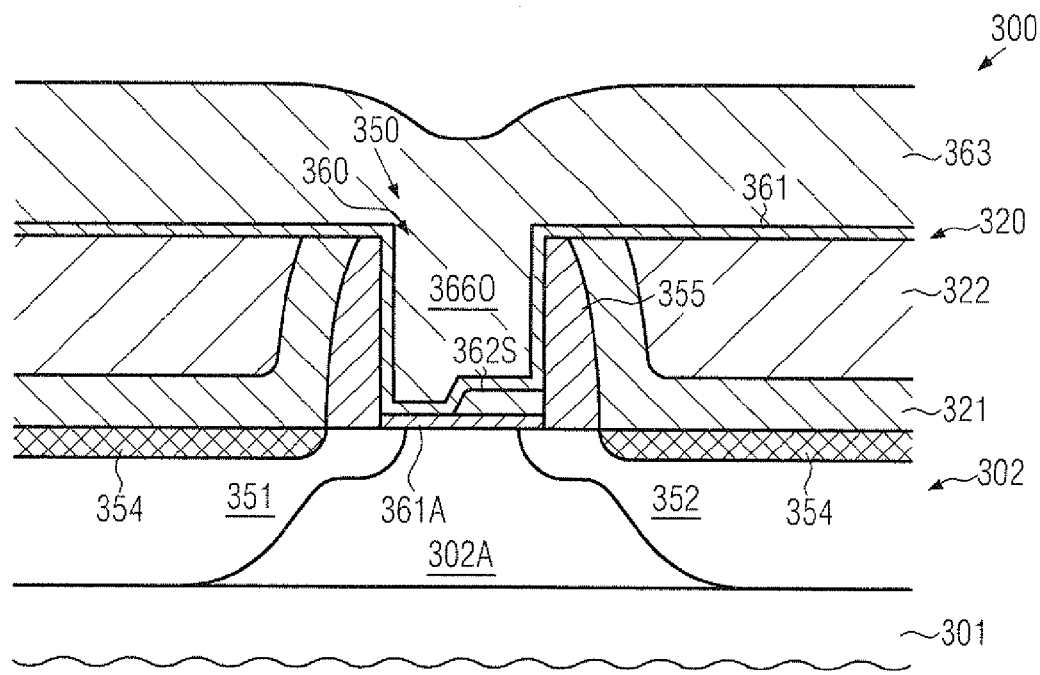
Figure 3F:
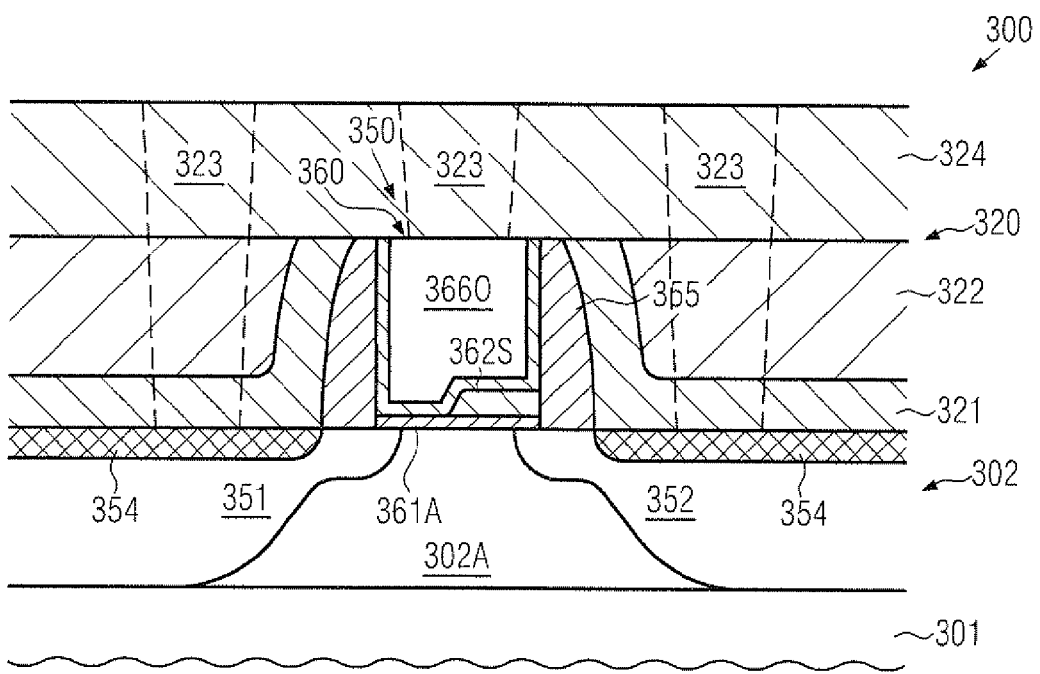
Figure 3G:
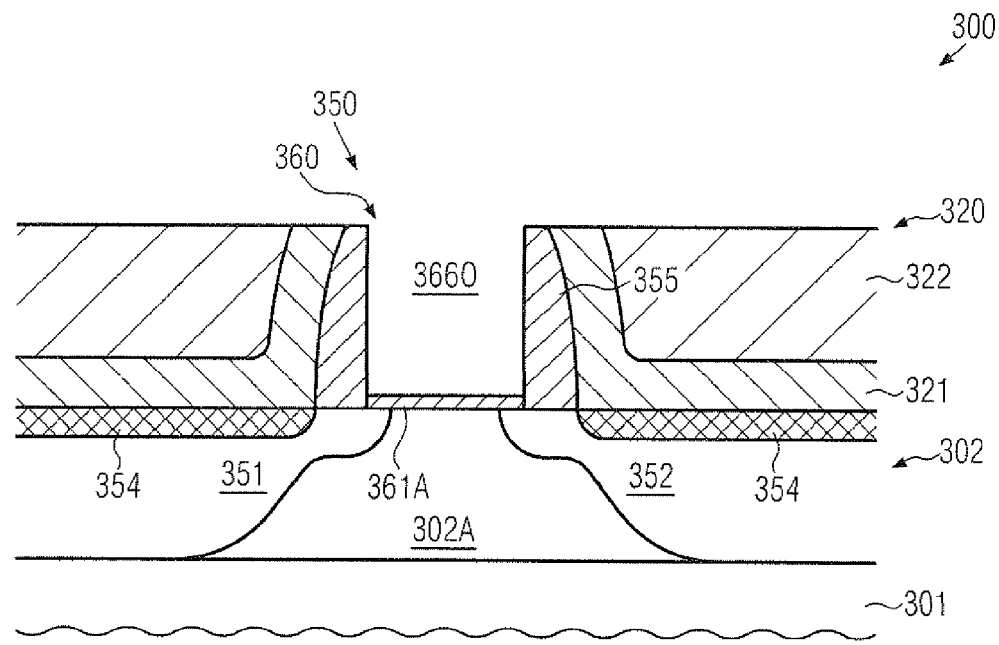
FIGS. 3g-3l schematically illustrate cross-sectional views of the semiconductor device according to illustrative embodiments in which the charge storage material, possibly in combination with an etch mask material, may be provided in a late manufacturing stage and may be patterned in a self-aligned manner.
Figure 3H:
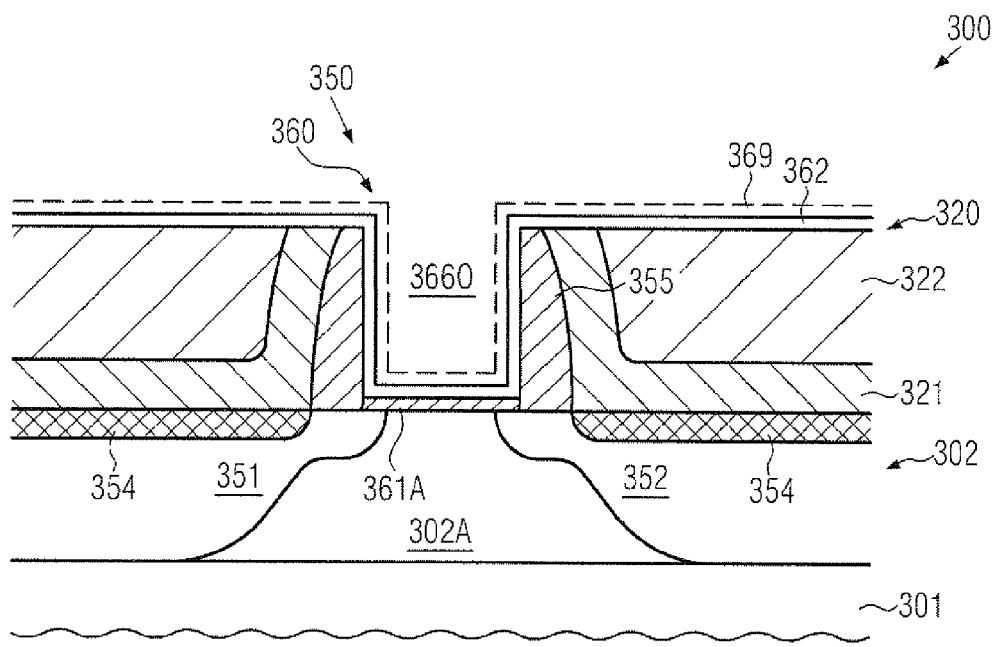
Figure 3I:
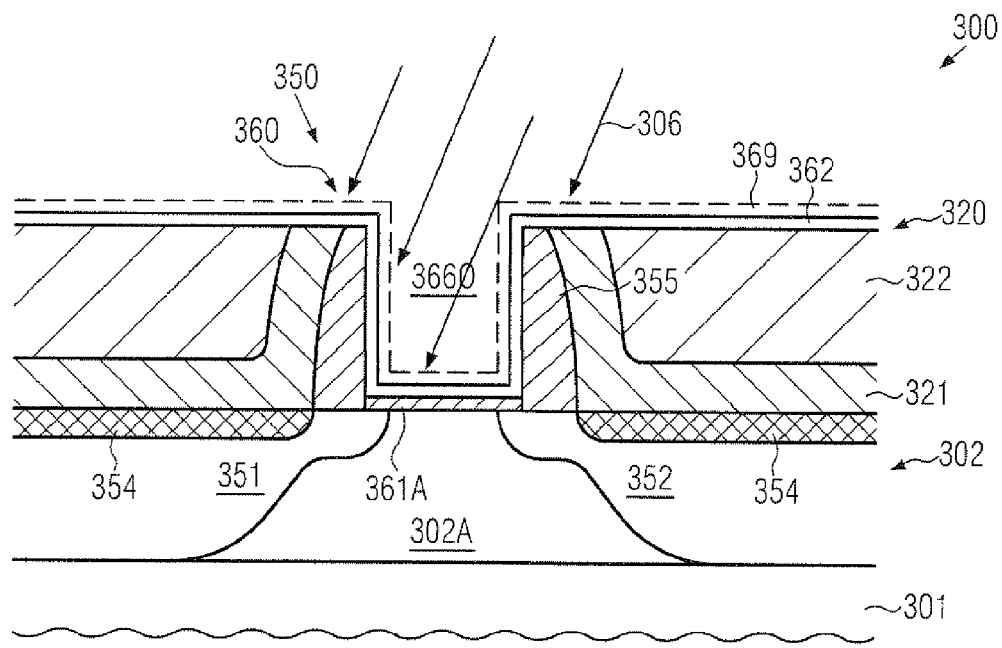
Figure 3J:
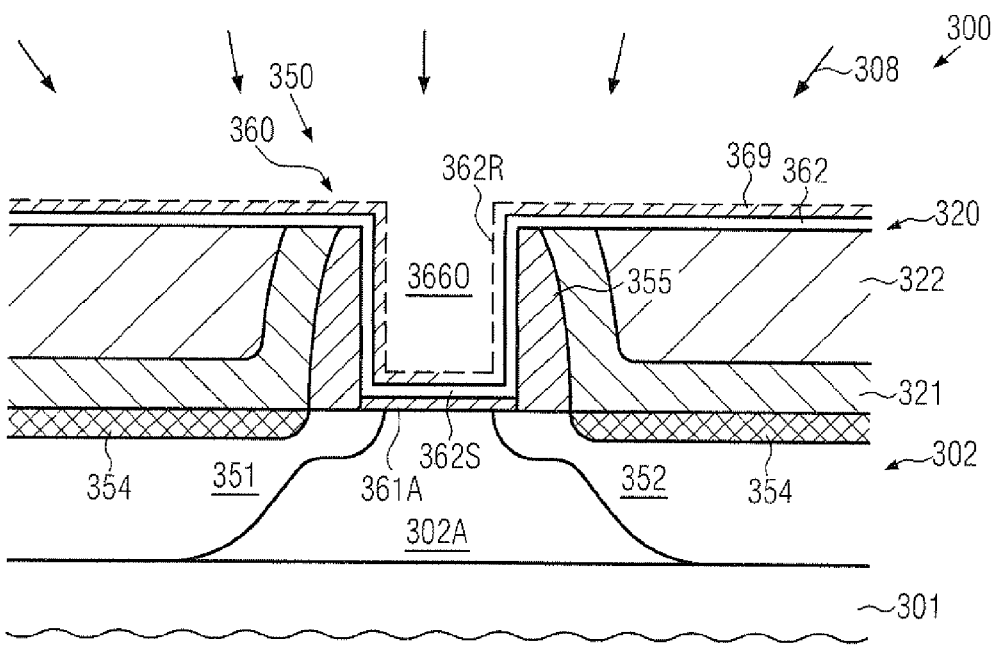
Figure 3K:
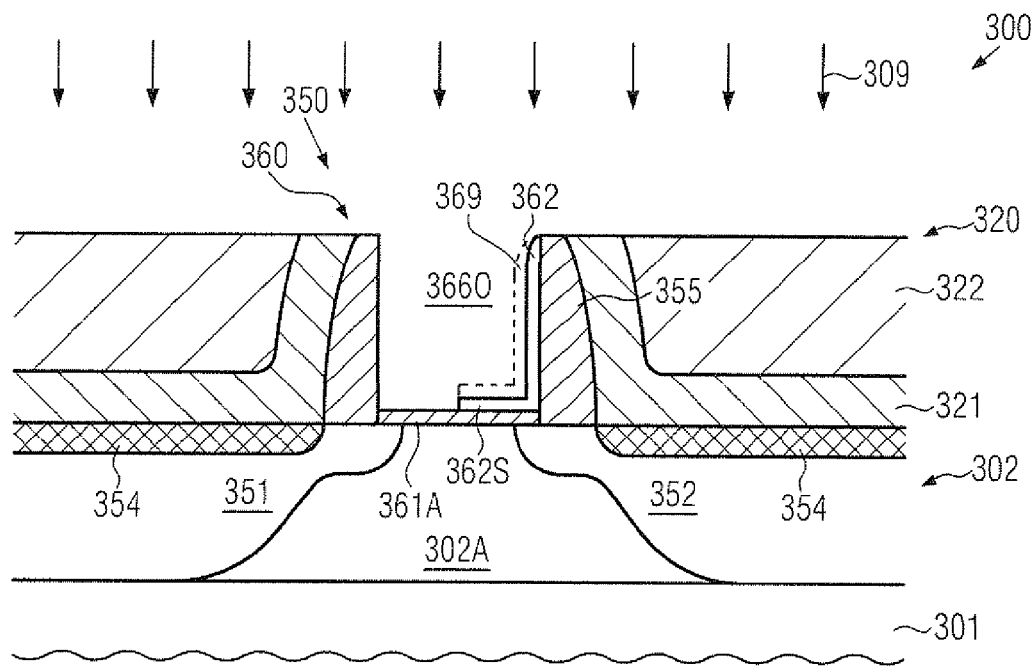
Figure 3L:
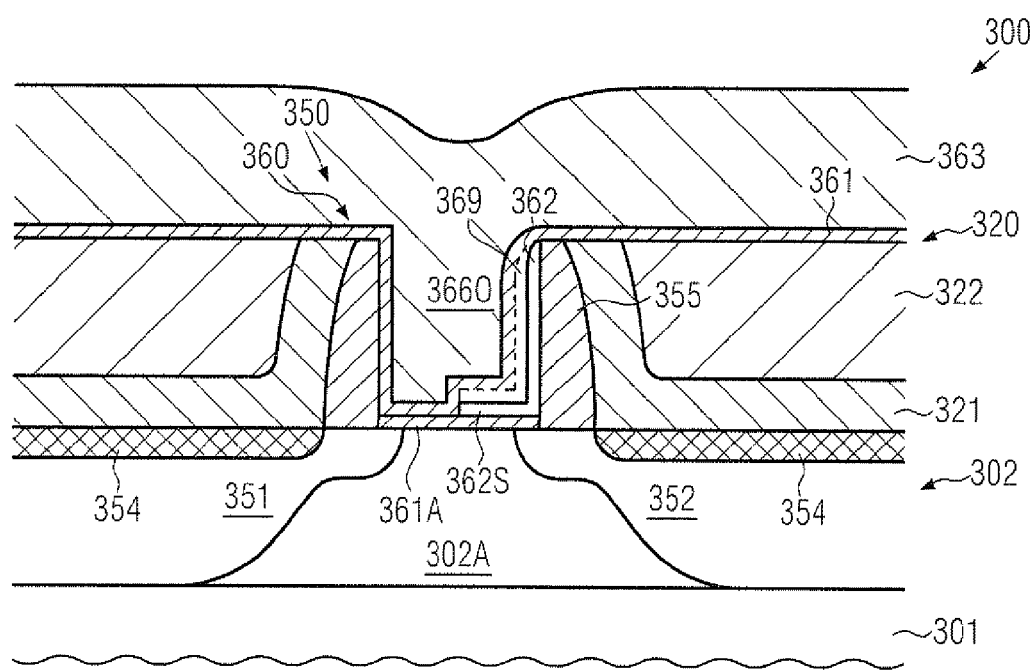
Figure 3M:
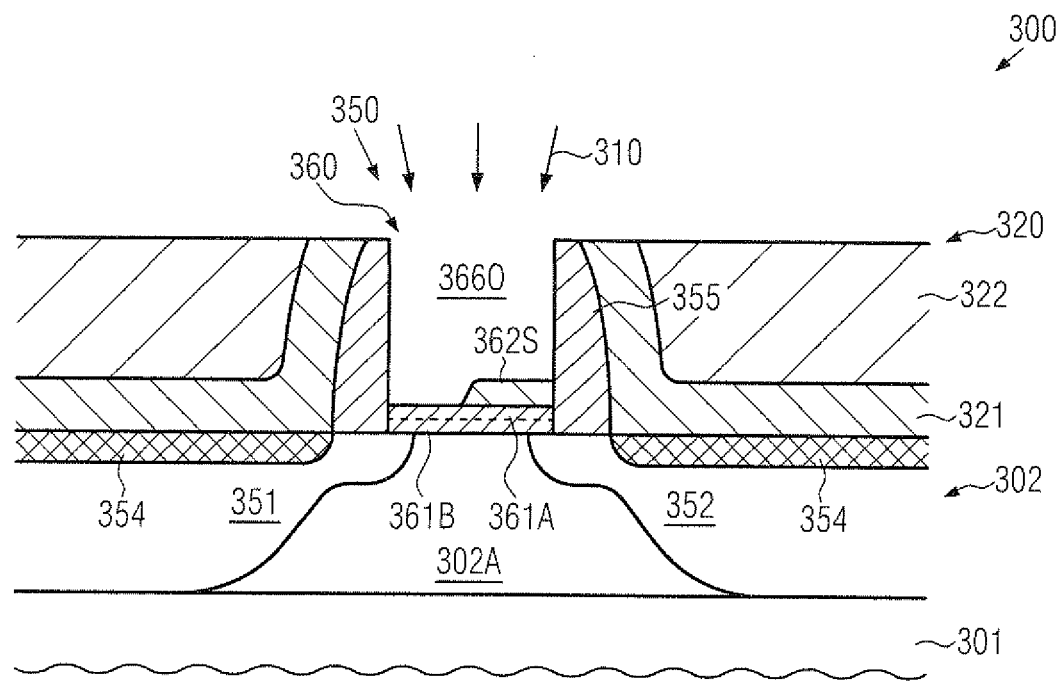
FIGS. 3m-3n schematically illustrate cross-sectional views of the semiconductor device comprising the self-aligned charge storage region within the gate electrode, wherein a high-k dielectric material may result in a superior programming and erasing behavior, according to still further illustrative embodiments.
Figure 3N:
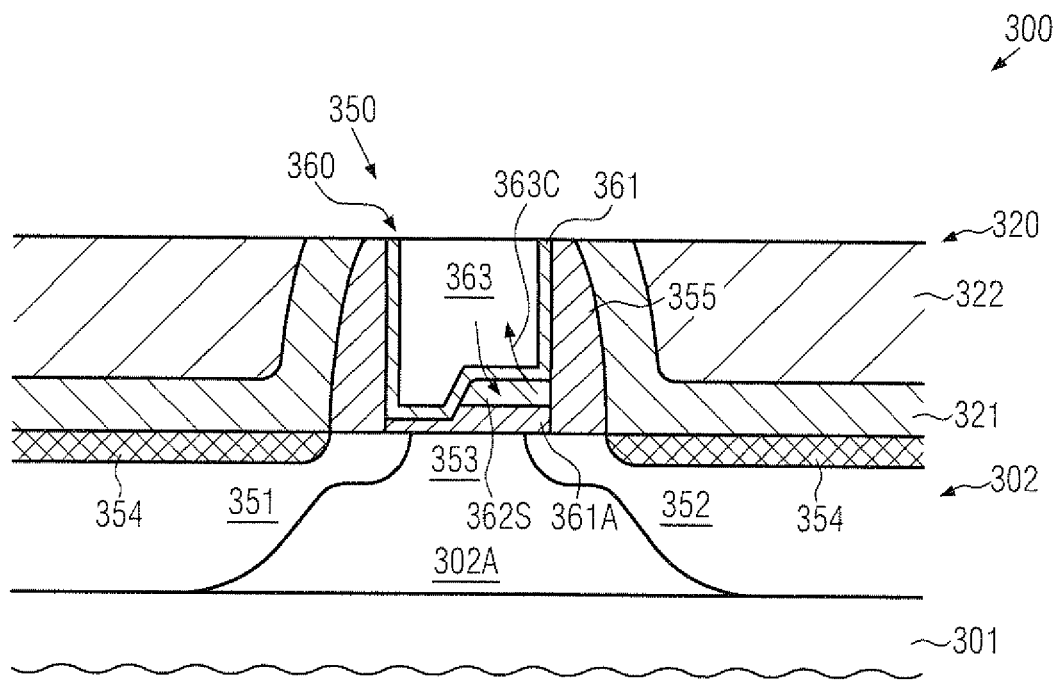

With reference to FIGS. 3a-3n, further illustrative embodiments will now be described, in which the charge storage region may be embedded in the gate electrode material, however, contrary to conventional strategies, in a self-aligned manner, i.e., without requiring an additional lithography process for patterning the charge storage region within the gate electrode structure.

FIG. 3a schematically illustrates a cross-sectional view of a semiconductor device 300 comprising a substrate 301 and a semiconductor layer 302, having formed therein an active region 302A, in and above which may be provided a storage transistor 350. The transistor 350 may comprise a gate electrode structure 360 including a placeholder material 366, such as polysilicon and the like. Moreover, a dielectric material 361A may be provided, for instance in the form of silicon dioxide, silicon oxynitride and the like. Additionally, a charge storage material 362, such as silicon nitride and the like, may be formed on the dielectric material 361A and may extend, contrary to conventional approaches, along the entire length of the gate electrode structure 360. The transistor 350 may further comprise drain and source regions 352, 351, which may have a symmetric configuration with respect to the gate electrode structure 360, i.e., the regions 352, 351 may overlap with the gate electrode 366, as required. Furthermore, metal silicide regions 354 may be provided in the drain and source regions 352, 351 and a contact structure 320, or at least a portion thereof, may be provided, for instance comprising materials 321, 322 in the form of silicon nitride, silicon dioxide and the like.

The semiconductor device 300 as illustrated in FIG. 3a may be formed on the basis of the following processes. The active region 302A may be provided in accordance with any appropriate process strategy, as is, for instance, previously discussed, and thereafter appropriate materials for the layers 361A, 362 and 366, possibly in combination with additional materials, such as a dielectric cap material, hard mask materials and the like, may be provided, and may finally be patterned in accordance with the desired critical dimensions. Thus, the charge storage material 362 may be patterned together with a gate layer stack. Thereafter, the drain and source regions 352, 351 may be provided in accordance with well-established implantation techniques, using, for instance, a sidewall spacer structure 355 as an implantation mask. After any anneal processes, the metal silicide regions 354 may be formed and the materials 321, 322 may be deposited and planarized, thereby exposing the material 366. Thereafter, the material 366 may be removed by any appropriate selective etch recipe, such as wet chemical etch recipes in the form of TMAH (tetra methyl ammonium hydroxide), in order to remove silicon material selectively with respect to dielectric materials. In other cases, plasma-assisted recipes, possibly in combination with wet chemical recipes, may be applied. During this etch process, the charge storage material 362 may act as an efficient etch stop material.

FIG. 3b schematically illustrates the semiconductor device 300 in an advanced manufacturing stage, in which a gate opening 360O may be provided in the gate electrode structure 360 upon removing the placeholder material 366 (FIG. 3a). Furthermore, the gate opening 360O may be used as an efficient implantation mask during an implantation process 306, in which an appropriate implantation species may be incorporated in the layer 362 in a locally selective manner within the gate opening 360O, thereby modifying the etch behavior of the material 362.

It is well known that a plurality of etch chemistries may respond highly sensitively to the incorporation of any material species into a base material, which may result in an increased or reduced etch rate. For example, hydrofluoric acid, which may be used for etching silicon dioxide, may also have a certain etch rate in a silicon nitride material, when incorporating therein an increased amount of hydrogen. Similarly, the etch rate of silicon dioxide may be modified upon introducing additional atomic species. Consequently, by performing the implantation process 306 so as to result in a locally varying incorporation of the implant species, the desired locally varying etch modification may be achieved. For example, an appropriate tilt angle beta ($\beta$), i.e., the angle between incoming ion beam and a surface normal 302S, may be selected such that a portion 362R at the source site of the transistor 350 may preferably be exposed to the ion bombardment, while a portion 362S may be efficiently shadowed. For example, by incorporating a hydrogen species, the etch rate of the material 362, if comprised of silicon nitride, may be strongly increased in the portion 362R. In other cases, any other appropriate material systems may be identified, in which the etch rate may be efficiently modified on the basis of an ion bombardment. For example, if a species may be identified which may result in a significant reduction of the etch rate, the implant angle beta may be selected so as to expose the portion 362S, while shadowing the portion 362R.

FIG. 3c schematically illustrates the semiconductor device 300 when exposed to a reactive etch ambient 307, in which the portion 362R (FIG. 3b) may be efficiently removed, while a significant amount of the region 362S may be preserved, thereby forming a charge storage region in the gate opening 360O. As discussed above, the etch process 307 may be established on the basis of any appropriate chemistry that responds in a sensitive manner to the incorporation of appropriate implantation species, as discussed above.

FIG. 3d schematically illustrates the device 300 in a further advanced manufacturing stage, in which a gate dielectric material 361, such as a high-k dielectric material, is formed in the gate opening 360O and on the charge storage region 362S and an exposed portion of the dielectric material 361A. To this end, any appropriate deposition technique may be applied, as is also previously discussed. It should be appreciated that, if desired, material 361A may be removed and may be replaced by any appropriate dielectric material, such as silicon dioxide and the like, having a desired thickness so as to act, in combination with the material 361, as an efficient gate dielectric material. In this case, the dielectric material 361A, formed below the region 362S may be appropriately adapted to the leakage behavior for transferring charge from and into the region 362S.

FIG. 3e schematically illustrates the device 300 with an electrode material 363 formed in and above the gate opening 360O. The material 363 may comprise any appropriate material or materials in order to provide the desired conductivity and to adjust the work function of the gate electrode structure 360 in accordance with device requirements. Thereafter, any excess material may be removed, for instance by CMP and the like, and the further processing may be continued by forming a dielectric material above the resulting structure.

FIG. 3f schematically illustrates the device 300 in which the contact structure 320 may comprise one or more further dielectric materials 324, which may then be patterned so as to form contact openings and corresponding contact elements 323 therein so as to connect to the transistor 350, as is also previously discussed.

The programming and erasing of the transistor 350 during operation may be accomplished on the basis of procedures as are also discussed above with reference to the conventional storage transistor 100.

FIG. 3g schematically illustrates the device 300 according to further illustrative embodiments, in which the gate opening 366O is provided in the gate electrode structure 360, wherein a charge storage material is still to be formed in the opening 366O. Consequently, in this case, a high degree of compatibility may be achieved for patterning the gate electrode structure 360 with respect to the gate electrode structures of any other field effect transistors.

FIG. 3h schematically illustrates the device 300 with the dielectric material 362 formed in the gate opening 366O. The material 362 may be provided in the form of a silicon nitride material, or any other appropriate charge storage material. Furthermore, in some illustrative embodiments, the material 362 may be provided together with a mask material 369, such as silicon dioxide and the like, depending on the availability of etch chemistries, which may efficiently respond to the incorporation of an implant species. The layers 362 and the optional layer 369 may be provided on the basis of any appropriate deposition technique, such as CVD and the like.

FIG. 3i schematically illustrates the device 300 during the ion implantation process 306, in which the gate opening 366O may be used as an efficient mask for selectively modifying the etch behavior of the material 362 and/or of the material 369, if provided. That is, an etch rate increasing or decreasing species may be efficiently implanted during the process 306.

FIG. 3j schematically illustrates the device 300 during an etch process 308, in which a portion of the material 362 may be removed, when the optional layer 369 is not provided, thereby maintaining the material 362 at least at the portion 362S, which may act as the charge storage region, as previously explained. In other cases, the etch process 308 may be used in order to pattern the mask material 369 so as to expose a portion 362R in the gate opening 366O. To this end, any appropriate etch recipe may be applied, which may respond sensitively to the implanted species, as discussed above.

FIG. 3k schematically illustrates the device 300 during a further etch process 309 in embodiments in which the material 369 may act as an efficient mask material. As indicated, the portion 362S may be preserved by the mask material 369, possibly in combination with material 362 at sidewalls of the gate electrode structure 360 at the drain site of the transistor 350. During the etch process 309, the exposed portion of the dielectric layer 361A may act as an efficient etch stop material, which may be subsequently removed and may be replaced by any other appropriate dielectric material, if desired.

FIG. 3*l* schematically illustrates the device 300 in an advanced manufacturing stage, in which a dielectric material 361, such as a high-k dielectric material, is provided in the gate electrode structure 360 together with the electrode material 363, which may have any appropriate configuration, as is also discussed above. Thereafter the further processing may be continued by removing any excess material, as explained above. Consequently, also in this case, the charge storage region 362S may be provided in a later manufacturing stage in a self-aligned manner, i.e., without requiring a specific lithography process.

FIG. 3*m* schematically illustrates the semiconductor device 300 according to further illustrative embodiments in which the charge storage region 362S may be provided selectively within the gate opening 366O in a self-aligned way, as is discussed above. More-over, the region 362S may be separated from the drain region 352 and the channel region 353 by the dielectric material 361A having a moderately high thickness so as to substantially avoid charge carrier transition upon programming and erasing the transistor 350. To this end, upon patterning the gate electrode structure 360, an appropriate material, such as silicon dioxide, silicon oxynitride, with a desired thickness may be used. After forming the material 362S, a further process 310 may be performed, for instance an etch process, for removing a portion of the material 361A, so as to reduce the thickness thereof, as indicated by 361B, while, in other illustrative embodiments, the exposed portion of the material 361A may be replaced by any other appropriate dielectric material having a desired composition and thickness. For example, in this case, the process 310 may additionally include an oxidation process, a surface treatment and the like. Thereafter, the further processing may be continued by depositing a high-k dielectric material within the gate opening 366O, as is also previously discussed, thereby also providing a high-k dielectric material on the charge storage region 362S. Thereafter, any appropriate electrode material may be deposited, as described above.

FIG. 3*n* schematically illustrates the semiconductor device 300 in a further advanced manufacturing stage. As illustrated, the gate electrode structure 360 may comprise a high-k dielectric material 361 in combination with electrode material 363. Consequently, the region 362S may be separated from the electrode 363 by the high-k dielectric material 361 and may be separated from the drain region 352 and the channel region 353 by the dielectric material 361A. Consequently, as previously discussed with reference to the device 200, the leakage current behavior of the high-k dielectric material 361 may be taken advantage of during the programming and erasing of the transistor 350 so that excess charge, indicated by 363C, may be injected into the region 362S or may be removed therefrom with the high-k dielectric material 361 into the electrode 363 without requiring hot carrier injection via the channel region 353 and the drain region 352. Consequently, as discussed before, also in this case, significantly reduced programming and erasing voltages may be applied, thereby significantly simplifying the operation of the transistor 350 during any write cycles.

As a result, the present disclosure provides manufacturing techniques, semiconductor devices and programming and erasing procedures in which superior performance and enhanced compatibility with complex manufacturing strategies may be accomplished by providing a self-aligned charge storage region embedded in the electrode material or in the form of a sidewall spacer. Moreover, in some illustrative embodiments, the leakage behavior of high-k dielectric materials may be efficiently exploited in order to reduce the required programming and erasing voltages. Consequently, non-volatile storage transistors may be implemented with reduced overall dimensions, while at the same time providing a high degree of flexibility in combining the non-volatile storage transistors with other sophisticated circuit elements and manufacturing strategies. For example, full replacement gate approaches may be applied, while, in other cases, conventional gate electrode structures or high-k metal gate electrode structures provided in an early manufacturing stage may be used in combination with the non-volatile storage transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of storing information in a non-volatile storage transistor, the method comprising:
    providing a charge storage region adjacent to and electrically insulated from a drain region and a gate electrode of said storage transistor, said charge storage region being positioned to influence charge flow in a channel region of said storage transistor, wherein providing said charge storage region comprises providing said charge storage region within said gate electrode and separated therefrom by a high-k dielectric material; and
    applying a programming voltage between said gate electrode and said drain region of said storage transistor so as to initiate charge carrier transfer from said gate electrode to said charge storage region.

2. The method of claim 1, wherein said programming voltage is approximately 5 volts or less.

3. The method of claim 1, wherein providing said charge-storage region comprises forming a charge storage material and adjusting an etch behavior of at least one of said charge storage material and a dielectric mask material so as to locally vary in a gate opening used to form the gate electrode structure.

4. The method of claim 3, further comprising performing a first etch process based on said at least one of said charge storage material and said mask material having said locally varying etch behavior.

5. The method of claim 4, wherein adjusting an etch behavior of at least one of said charge storage material and said mask material comprises performing an implantation process using a tilt angle.

6. The method of claim 4, wherein forming said charge storage region further comprises performing a second etch process and using said mask material as an etch mask after performing said first etch process.

\* \* \* \* \*